US008455606B2

(12) United States Patent
Zhu et al.

(10) Patent No.: US 8,455,606 B2
(45) Date of Patent: *Jun. 4, 2013

(54) PHOTOACTIVE POLYMERS

(75) Inventors: Zhengguo Zhu, Chelmsford, MA (US); David Waller, Lexington, MA (US)

(73) Assignee: Merck Patent GmbH, Darmstadt (DE)

( * ) Notice: Subject to any disclaimer, the term of this patent is extended or adjusted under 35 U.S.C. 154(b) by 238 days.

This patent is subject to a terminal disclaimer.

(21) Appl. No.: 12/495,931

(22) Filed: Jul. 1, 2009

(65) Prior Publication Data

US 2010/0032018 A1     Feb. 11, 2010

Related U.S. Application Data

(60) Provisional application No. 61/086,977, filed on Aug. 7, 2008.

(51) Int. Cl.
*C08G 77/04* (2006.01)
(52) U.S. Cl.
USPC ............ 528/37; 528/377; 528/380; 528/373; 136/261
(58) Field of Classification Search
USPC ................... 528/37, 377, 373, 380; 136/261
See application file for complete search history.

(56) References Cited

U.S. PATENT DOCUMENTS

| | | | |
|---|---|---|---|
| 4,292,092 A | 9/1981 | Hanak | |
| 4,416,959 A | 11/1983 | Skotheim | |
| 4,574,160 A | 3/1986 | Cull et al. | |
| 4,639,328 A | 1/1987 | Krause et al. | |
| 4,686,323 A | 8/1987 | Biter et al. | |
| 4,746,618 A | 5/1988 | Nath et al. | |
| 4,795,687 A | 1/1989 | Suzuki et al. | |
| 4,913,744 A | 4/1990 | Hoegl et al. | |
| 4,948,436 A | 8/1990 | Juergens | |
| 5,071,490 A | 12/1991 | Yokota et al. | |
| 5,221,363 A | 6/1993 | Gillard | |
| 5,274,058 A | 12/1993 | Ferraris et al. | |
| 5,510,438 A | 4/1996 | Ferraris et al. | |
| 5,536,808 A | 7/1996 | Curtis et al. | |
| 5,708,130 A | 1/1998 | Woo et al. | |
| 6,109,330 A | 8/2000 | Crisp | |
| 6,132,585 A | 10/2000 | Midorikawa et al. | |
| 6,188,175 B1 | 2/2001 | May et al. | |
| 6,198,091 B1 | 3/2001 | Forrest et al. | |
| 6,198,092 B1 | 3/2001 | Bulovic et al. | |
| 6,239,355 B1 | 5/2001 | Salafsky | |
| 6,278,055 B1 | 8/2001 | Forrest et al. | |
| 6,297,495 B1 | 10/2001 | Bulovic et al. | |

(Continued)

FOREIGN PATENT DOCUMENTS

| | | |
|---|---|---|
| DE | 31 21 350 | 7/1982 |
| DE | 103 26 547 | 1/2005 |

(Continued)

OTHER PUBLICATIONS

Ando et al., "Synthesis, physical properties, and field-effect transistors of novel thiophene/thiazolothiazole co-oligomers," J. Mater. Chem., vol. 14, 1787-1790, 2004.

(Continued)

*Primary Examiner* — Shane Fang
(74) *Attorney, Agent, or Firm* — Bowditch & Dewey, LLP; Roger P. Zimmerman

(57) ABSTRACT

Novel photoactive polymers, as well as related components, articles, systems, and methods are disclosed.

41 Claims, 3 Drawing Sheets

U.S. PATENT DOCUMENTS

| | | | |
|---|---|---|---|
| 6,333,458 B1 | 12/2001 | Forrest et al. |
| 6,352,777 B1 | 3/2002 | Bulovic et al. |
| 6,353,083 B1 | 3/2002 | Inbasekaran et al. |
| 6,399,224 B1 | 6/2002 | Li |
| 6,440,769 B2 | 8/2002 | Peumans et al. |
| 6,451,415 B1 | 9/2002 | Forrest et al. |
| 6,464,762 B1 | 10/2002 | Arao |
| 6,580,027 B2 | 6/2003 | Forrest et al. |
| 6,657,378 B2 | 12/2003 | Forrest et al. |
| 6,772,817 B2 | 8/2004 | Lai et al. |
| 6,818,260 B2 | 11/2004 | Farrand et al. |
| 6,864,333 B2 | 3/2005 | Dall'Occo et al. |
| 7,095,044 B2 | 8/2006 | Brown et al. |
| 7,105,237 B2 | 9/2006 | Sotzing |
| 7,196,366 B2 | 3/2007 | Forrest et al. |
| 7,309,833 B2 | 12/2007 | Robeson et al. |
| 7,368,510 B2 | 5/2008 | Lee et al. |
| 7,405,775 B2 | 7/2008 | Nilsson |
| 2002/0040728 A1 | 4/2002 | Yoshikawa |
| 2002/0050289 A1 | 5/2002 | Wada et al. |
| 2002/0105005 A1 | 8/2002 | Seo et al. |
| 2003/0008172 A1 | 1/2003 | Leclerc et al. |
| 2003/0023029 A1 | 1/2003 | Wang et al. |
| 2003/0036612 A1 | 2/2003 | Nifant'ev et al. |
| 2003/0042471 A1 | 3/2003 | Giles et al. |
| 2003/0102024 A1 | 6/2003 | Zeira et al. |
| 2003/0127967 A1 | 7/2003 | Tsutsui et al. |
| 2003/0159729 A1 | 8/2003 | Shaheen et al. |
| 2003/0175411 A1 | 9/2003 | Kodas et al. |
| 2003/0188777 A1 | 10/2003 | Gaudiana et al. |
| 2003/0189402 A1 | 10/2003 | Gaudiana et al. |
| 2003/0230225 A1 | 12/2003 | Tsukahara |
| 2003/0230335 A1 | 12/2003 | Tsukahara |
| 2004/0118448 A1 | 6/2004 | Scher et al. |
| 2004/0187911 A1 | 9/2004 | Gaudiana et al. |
| 2004/0192871 A1 | 9/2004 | Wang et al. |
| 2004/0201018 A1 | 10/2004 | Yamahara et al. |
| 2004/0256615 A1 | 12/2004 | Sirringhaus et al. |
| 2005/0022865 A1 | 2/2005 | Robeson et al. |
| 2005/0124784 A1 | 6/2005 | Sotzing |
| 2005/0145972 A1 | 7/2005 | Fukuda et al. |
| 2005/0194038 A1 | 9/2005 | Brabec et al. |
| 2005/0224905 A1 | 10/2005 | Forrest et al. |
| 2006/0022192 A1 | 2/2006 | Brabec et al. |
| 2006/0027834 A1 | 2/2006 | Forrest et al. |
| 2006/0076050 A1 | 4/2006 | Williams et al. |
| 2006/0141662 A1 | 6/2006 | Brabec et al. |
| 2006/0155106 A1 | 7/2006 | Roberts et al. |
| 2007/0014939 A1 | 1/2007 | Gaudiana et al. |
| 2007/0017571 A1 | 1/2007 | Gaudiana et al. |
| 2007/0020526 A1 | 1/2007 | Gaudiana et al. |
| 2007/0120045 A1 | 5/2007 | Yokoyama |
| 2007/0158620 A1 | 7/2007 | Gaudiana et al. |
| 2007/0181179 A1 | 8/2007 | Brabec et al. |
| 2007/0193621 A1 | 8/2007 | Brabec et al. |
| 2008/0053518 A1 | 3/2008 | Change et al. |
| 2008/0264488 A1 | 10/2008 | Balasubramanian |

FOREIGN PATENT DOCUMENTS

| | | |
|---|---|---|
| DE | 69330835 | 2/2007 |
| EP | 0 251 598 | 1/1988 |
| EP | 1 065 725 | 1/2001 |
| EP | 1318553 | 6/2003 |
| EP | 1507298 | 2/2005 |
| EP | 1562154 | 8/2005 |
| JP | 04-192376 | 7/1992 |
| JP | 2001 060707 | 3/2001 |
| JP | 2002-141524 | 5/2002 |
| JP | 03-073382 | 3/2003 |
| JP | 2003-515933 | 5/2003 |
| JP | 2003 264085 | 9/2003 |
| JP | 04-534863 | 6/2004 |
| JP | 05-011841 | 1/2005 |
| JP | 06-166746 | 6/2006 |
| JP | 06-278682 | 10/2006 |
| KR | 100685796 | 2/2007 |
| WO | WO 93/05077 | 3/1993 |
| WO | WO 94/14199 | 6/1994 |
| WO | WO 97/05184 | 2/1997 |
| WO | WO 00/11725 | 3/2000 |
| WO | WO 00/22682 | 4/2000 |
| WO | WO 00/46321 | 8/2000 |
| WO | WO 01/39276 | 5/2001 |
| WO | WO 02/059121 | 8/2002 |
| WO | WO 02/101838 | 12/2002 |
| WO | WO 03/065462 | 8/2003 |
| WO | WO 2004/042824 | 5/2004 |
| WO | WO 2004/051756 | 6/2004 |
| WO | WO 2005/092947 | 10/2005 |
| WO | WO 2005/111045 | 11/2005 |
| WO | WO 2007/011739 | 1/2007 |
| WO | WO2007022226 | 2/2007 |
| WO | WO 2007/076427 | 7/2007 |
| WO | WO 2007/121252 | 10/2007 |
| WO | WO 2007/133705 | 11/2007 |
| WO | WO 2007/145482 | 12/2007 |
| WO | WO 2008/000664 | 1/2008 |
| WO | WO 2010/008672 | 1/2010 |

OTHER PUBLICATIONS

Asawapirom et al., "Dialkylcyclopentadithiophene Polymers and Copolymers," *Macromolecular Rapid Communications*, 22:746-749, 2001.

Bakhshi et al., "Strategies for Molecular Designing of Novel Low-Band-Gap Electrically Conducting Polymers," *Applied Biochemistry and Biotechnology*, 96:125-133, 2001.

Bakhshi et al., "Electronic Structures of Donor-Acceptor Polymers Based on Polythiophene, Polyfuran and Polypyrrole," *Molecular Engineering*, 6:239-248, 1996.

Bakhshi et al., "Ab initio study of the electronic structures and conduction properties of some donor-acceptor polymers and their copolymers," *Journal of Chemical Physics*, 119:13159-13169, 2003.

Baumgartner, "π-Conjugated Heterocyclic fused Bithiophene Materials," *J. Inorganic and Organometallic Polymers and Materials*, 15(4):389-409, 2005.

Berlin et al., "Self-assembly of mono- and multilayers of polyconjugated conducting polymers," *Macromolecular Rapid Communications*, 21:301-318, 2000.

Berlin et al., "Thiophene/Cyclopentadiene Regular Copolymers from Electrochemical Oxidation of Dithienylcyclopentadienes," *Macromolecular Chemistry and Physics*, 203:1228-1237, 2002.

Coppo et al., "Cyclopentadithiophene based electroactive materials," *J. Mater. Chem.*, 15:1123-1133, 2005.

Coppo et al., "Investigation of the electronic properties of cyclopentadithiophene polymers and copolymers," *Mat. Res. Soc. Symp. Proc.*, 771:L4.9.1-L4.9.4, 2003.

Coppo et al., "New routes to poly(4,4-dialkylcyclopentadithiophene-2,6-diyls)," *J. Mater. Chem.*, 12:2597-2599, 2002.

Coppo et al., "Synthesis, solid state structure and polymerisation of a fully planar cyclopentadithiophene," *Chem. Commun.*, 2548-2549, 2003.

Coppo et al., "Synthetic Routes to Solution-Processable Polycyclopentadithiophenes," *Macromolecules*, 35:2705-2711, 2003.

Cravino et al., "Nanostructured Bipolar Organic Polymers," *Encyclopedia of Nanoscience and Nanotechnology*, 7:615-628, 2004.

Cravino et al., "*Double-cable* polymers for fullerene based organic optoelectronic applications," *J. Mater. Chem.*, 12:1931-1943, 2002.

Dai, "Conjugated and Fullerene-Containing Polymers for Electronic and Photonic Applications: Advanced Syntheses and Microlithographic Fabrications," *Journal of Macromolecular Science, Part C—Reviews in Macromolecular Chemistry and Physics*, 39:273-387, 1999.

Gadisa et al., "Improvements of fill factor in solar cells based on blends of polyfluorene copolymers as electron donors," Thin Solid Films, 515:3126-3131, (2007).

Hiramoto et al., "Effect of Thin Gold Interstitial-layer on the Photovoltaic Properties of Tandem Organic Solar Cell," *Chemistry Letters*, The Chemistry Society of Japan, pp. 327-330, 1990.

Huang et al., "In-situ conductivity of a low band-gap conducting polymer. Measurement of intrinsic Conductivity," Acta Polymerica, vol. 48(10), (1997).

Huang et al., "A Donor-Acceptor Conducting Copolymer with a Very Low Band Gap and High Intrinsic Conductivity," Chem. Mater., vol. 10, No. 8, pp. 2212-2216, (1998).

Huang et al., "Oxygen-Modified Poly(4-dicyanomethylene-4H-cyclopenta[2,1-b;3,4-b]dithiophene: A Tunable Low band Gap Polymer," Chem. Mater., vol. 11, No. 6, pp. 1541-1545, (1999).

Jespersen et al., "The electronic states of polyfluorene copolymers with alternating donor-acceptor units," J. Chem. Phy., 121(24):12613-12617, 2004.

Kim et al., "Influence of electron-donating polymer addition on the performance of polymer solar cells," J. Phys. D: Appl. Phys., 41:1-5, (2008).

Ko et al., "Electrochemistry and electrochromism of a poly(cyclopentadithiophene) derivative with a viologa pendant," Electrochimica Acta. vol. 48, pp. 4127-4135, (2003).

Kunugi et al., "Charge transport in a regioregular poly(3-octylthiophene) film," J. Mater. Chem., 10:2673-2677, 2000.

Larmat et al., "Comparative Reactivity of Thiophene and 3,4-(Ethylenedioxy) thiophene as Terminal Electropolymerizable Units in Bis-Heterocycle Arylenes," Journal of Polymer Science: Part A: Polymer Chemistry, 35:3627-3636, 1997.

Muhlbacher et al., "High Photovoltaic Performance of a Low-Bandgap Polymer," Adv. Mater., 18:2884-2889, 2006.

Ohshita et al., "Synthesis of Polymers Composed of Alternating Diphenylenedithienosilole and Diethynylenesilyene Units and Their Applications to Hole Transport in Double-Layer EL Devices" Macromolecules, vol. 33, pp. 8890-8893, 2000. Entire document, especially Scheme 1, p. 8890; Table 2.

Plater et al., "Cyclopenta-1,2,3-dithiazoles and related compounds," J. Chem.. Soc., Perkin Trans. 1, Issue 7, 769-774, 1993. Abstract.

Prato, "Fullerene Materials," Topics in Current Chemistry, 199:173-187, 1999.

Roncali, "Linear π-conjugated systems with tailored electronic properties," Annu. Rep. Prog. Chem., Sect. C, 95:47-88, 1999.

Roncali, "Linear π-conjugated systems derivatized with $C_{60}$-fullerene as molecular heterojunctions for organic photovoltaics," Chem. Soc. Rev., 34:483-495, 2005.

Scherf et al., "Semiconducting Polyfluorenes—Towards Reliable Structure-Property Relationships," Advanced Materials, 14:477-487, 2002.

Sensfuss et al., Characterisation of potential donor acceptor pairs for polymer solar cells by ESR, optical and electrochemical investigations, vol. 5215, Proc. Of SP1E129-140, 2004.

Subramanian et al., "Trends in Geometric and Electronic Properties of Thiophene- and Cyclopentadiene-Based Polymers," International Journal of Quantum Chemistry, 66:229-240, 1998.

Usta et al., "Dithienosilole- and Dibenzosilole-Thiophene Copolymers as Semiconductors for Organic Thin-Film Transistors," J. Am. Chem., 128:9034-9035, 2006.

Wang et al., "Conjugated Fluorene and Silole Copolymers: Synthesis, Characterization, Electronic Transition, Light Emission, Photovoltaic Cell, and Field Effect Hole Mobility," Macromolecules, 38:2253-2260, 2005.

Winder et al., "Sensitization of low bandgap polymer bulk heterojunction solar cells," Thin Solid Films, 403-404:373-379, (2002).

Wong et al., "Efficient photovoltaic cells with wide photosensitization range fabricated from rhenium benzathiazole complexes," App. Phys. Letters, 90:1-3, (2007).

Wu et al., "Low band gap-conjugated polymer derivatives," Synthetic Metals. vol. 155, pp. 618-622 (2005).

Yonezawa et al., "Preparation and properties of oligomers containing cyclopentadithiophene," Synthetic Metals, 119:99-100, 2001.

Yoon et al., "Organic Thin-Film Transistors Based on Carbonyl-Functionalized Quaterthiophenes: High Mobility N-Channel Semiconductors and Ambipolar Transport," J. Am. Chem. Soc. vol. 127, pp. 1348-1349, (2005).

Zhu et al., "Panchromatic Conjugated Polymers Containing Alternation Donor/Acceptor Units for Photovoltaic Applications," 40:1981-1986, 2007.

Zotti et al., "Polymers, Dimers and Radical Cations from Electrochemical Oxidation of Interring-Bridged Thiophene and Thiophene-Phenylene Tetramers," Macromolecular Chemistry and Physics, 202:3049-3056, 2001.

Zotti et al., "Novel, Highly Conducting, and Soluble Polymers from Anodic Coupling of Alkyl-Substituted Cyclopentadithiophene Monomers," Macromolecules, 27:1938-1942, 1994.

Bjorstrom et al., "Multilayer formation in spin-coated thin films of low-bandgap polyfluorene:PCBM blends," J. Phys. Condens. Matter 17:L529-L534, 2005.

Drechsel et al., "High efficiency organic solar cells based on single or multiple PIN structures," Thin Solid Films, vol. 451-452:515-517, 2004.

Greenham et al., "Charge separation and transport in conjugated polymer/cadmium selenide nanocrystal composites studied by photoluminescence quenching and photoconductivity," Synthetic Metals, 84:545-546, 1997.

Hiramoto et al., "Design of nanostructures for photoelectric conversion using an organic vertical superlattice," Appl. Phys. Letters, 88:213105, 2006.

Liao et al., "Photovoltaic Dithienosilole-Containing Polymers," Macromoleculs, vol. 40, pp. 9406-9412 (2007).

Takamoto et al., "Two-Terminal Monolithic Ino.5Gao.5P/GaAs Tandem Solar Cells with a High Conversion Efficiency of Over 30%," Jap. J. Appl. Physics, 36(10):6215-6220, 1997.

Umeda et al., "Fabrication of Interpenetrating Semilayered Structure of Conducting Polymer and Fullerene by Solvent Corrosion Method and Its Photovoltaic Properties," Jap. J. Appl. Physics, 44(6A):4155-4160, 2005.

Xue, et al., "Asymmetric tandem organic photovoltaic cells with hybrid planar-mixed molecular heterojunctions," Appl. Phys. Letters, 85(23):5757-5759, 2004.

Yakimov et al., "High photovoltage multiple-heterojunction organic solar cells incorporating interfacial metallic nanoclusters," Applied Physics Letters, vol. 80, No. 9, Mar. 2002.

Yamaguchi et al., "Multi-junction III-V solar cells: current status and future potential," Solar Energy, 79(1):78-85, 2005.

Ahmed, et al., "Benzobisthiazole-Thiophene Copolymer Semiconductors: Synthesis, Enhanced Stability, Field-Effect Transistors, and Efficient Solar Cells", Macromolecules 2009, 42, 8615-8618.

Ando, et al., "Characterization and Field-Effect Transistor Performance of Heterocyclic Oligomers Containing a Thiazolothiazole Unit", Chemistry Letter vol. 33, No. 9, 1170-1171 (2004).

Ando, et al., "Synthesis, physical properties, and field-effect transistors of novel thiophene/ thiazolothiazole co-oligomers", J. Mater, Chem., 2004, 14, 1787-1790.

Chen, et al., "Polymer solar cells with enhanced open-circuit voltage and efficiency", Nature Photonics, vol. 3, 649-653, Nov. 2009.

European Search Report dated Nov. 10, 2010, Application No. 10177632.6.

Hou, et al., "Synthesis, Characterization, and Photovoltaic Properties of a Low Band Gap Polymer Based on Silole-Containing Polythiophenes and 2, 1, 3-Benzothiadiazole", J. Am. Chem. Soc. 2008, 130, 16144-16145.

Hou, et al., "Bandgap and Molecular Energy Level Control of Conjugated Polymer Photovoltaic Materials Based on Benzo[1,2-b:4,5-b']dithiophene", Macromolecules 2008, 41, 6012-6018.

International Search Report dated Jan. 27, 2011, PCT/US2010/026222.

Li, et al., "High-efficiency solution processable polymer photovoltaic cells by self-organization of polymer blends", Nature Materials vol. 4, 864-868, Nov. 2005.

Liu et al., "Efficient green-light-emitting diodes from silole-containing copolymers" 15, 3496-3500 (2003).

Maksudul, et al., "Polybenzobisazoles Are Efficient Electron Transport Materials for Improving the Performance and Stability of Polymer Light-Emitting Diodes", Chem. Mater. 2002, 14, 4775-4780.

Mike, et al., "Facile Synthesis of 2, 6-Disubstituted Benzobisthiazoles: Functional Monomers for the Design of Organic Semiconductors", J. Org. Chem. 2010, 75, 495-497.

Mike, et al., An Efficient Synthesis of 2, 6-Disubstituted Benzobisoxazoles: New Building Blocks for Organic Semiconductors, Org. Lett., vol. 10, No. 21, 4915-4918, 2008.

Mike, et al., "Synthesis and Characterization of Dialkoxy Substituted Poly(phenylenevinylene) Benzobisoxazoles", Rapid Communication, J. Polym. Sci Part A: Polym. Chem.: vol. 48, 1456-1460, (2010).

Osahen, et al., "Electroactive and Photoactive Rod-Coil Copolymers: Design, Synthesis, and Supramolecular Regulation of Photophysical Properties", J. Am. Chem. Soc. 1995,117, 7389-7398.

Osaka, et al., "Novel Thiophene-Thiazolothiazole Copolymers for Organic Field-Effect Transistors", Adv. Mater. 2007, 19, 4160-4165.

Osaka, et al., "High-Lamellar Ordering and Amorphous-Like π-Network in Short-Chain Thiazolothiazole-Thiophene Copolymers Lead to High Mobilities", J. Am. Chem. Soc. 2009, 131, 2521-2529.

Peet et al., "Efficiency enhancement in low-bandgap polymer solar cells by processing with alkane dithiols", Nat. Mat., 6:497-500, 2007.

Peng et al., "Synthesis and electroluminescent properties of copolymers based on fluorine and 2,5-di(2-hexyloxypheny)thiazologhiazole", Macromolecules 38, 7292-7298 (2005).

Shrotriya, V., "Plastic Solar Cells", Organic Semiconductor Conference, 1-33 (2009).

So, et al., "Synthesis and Photophysical Properties of Some Benzoxazole and Benzothiazole Compounds", Macromolecules 1996, 29, 2784-2795.

Zhang, et al., "Polymer Solar Cells Based on a Low-Bandgap Fluorene Copolymer and a Fullerene Derivative with Photocurrent Extended to 850 nm", Adv. Funct. Mater. 2005, No. 15, 745-750.

A. C. Arias, et al., Vertically segregated polymer-blend photovoltaic thin-film structures through surface-mediated solution processing, applied physics letters, vol. 80, No. 10 Mar. 11, 2002.

Anthony M Higgins, et al., "Surface segregation and self-stratification in blends of spin-cast polyfluorene derivatives", J. Phys.: Condens. Matter 17 (2005) 1319-1328.

Hwajeong Kim, et al., "Distinct Annealing Temperature in Polymer:Fullerene:Polymer Ternary Blend Solar Cells", J. Phys. Chem. C, 2009, 113 (4), 1620-1623 DOI: 10.1021/ jp809589n, Publication Date (Web): Jan. 5, 2009.

Swager et al., "The molecular wire approach to sensory signal amplifiers," Acc. Chem. Res., 1998, 31, 201-207.

Van Duren, "R.A.J. Low-bandgap Polymer Photovoltaic Cells," Synthetic Metals, 121:1587-1588, 2001.

Zhou et al., "Fluorene based low band gap copolymers for photovoltaic devices," Applied Physics Letters, vol. 84, No. 10, 1653-1655, Mar. 8, 2004.

Gao, et al., "Efficient photodetectors and photovoltaic cells from composites of fullerenes and conjugated polymers: photoinduced electron transfer", Synthetic Metals 84 (1997) 979-980.

Niu, Applied Physics Letters, 2003, vol. 82, No. 13, 2163-2165.

Hu and Matsumura, "Structure and thickness dependence of p-n heterojunction solar cells based on copper phthalocyanine and perylene pigments", *Institute of Physics Publishing Journal of Physics D: Applied Physics*, J. Phys. D: Appl. Phys., 37:1434-1438 (2004).

Peumans et al., "Efficient photon harvesting at high optical intensities in ultrathin organic double-heterostructure photovoltaic diodes", *American Institute of Physics*, Applied Physics Letter, 76(19):2650-2652 (2000).

Roman et al., "High Quantum Efficiency Polythiophene/C60 Photodiodes," Adv. Mat., 10:774-777, 1998.

Barbarella et al., "Oligothiophene-S, S dioxides: a New Class of Thiophene based Materials", Journal of Organic Chemistry, Optical Materials 9 (1998) 43-45.

European Search Report dated Feb. 24, 2011, Application No. 10177632.6.

International Preliminary Report on Patentability dated Feb. 8, 2011 issued in PCT/US2009/049701.

Jayakanna, et al., "Synthesis and Structure-Property Relationship of New Donor-Acceptor-Type Conjugated Monomers on the Basis of Thiophene and Benzothiadiazole", Journal of Polymer Science Part A: Polymer Chemistry, vol. 40, 251-261 (2002).

Kunai et al., "Synthesis and properties of silicon-bridged bithiophenes and application to EL devices," Synthetic Metals, Elsevier Sequoia Lausanne, CH, vol. 137, No. 1-3, Jan. 1, 2003, pp. 1007-1008.

Supplemental European Search Report dated Mar. 4, 2011, Application No. 07872313.7.

Supplemental European Search Report dated Mar. 4, 2011, Application No. 06787321.6.

Kong et al. "Single-Walled Carbon Nanotube Gold Nanohybrids: Application in Highly Effective Transparent and Conductive Films", J. Phys. Chem. C 2007, 111, p. 8377-8382.

PHOTOACTIVE POLYMERS

CROSS REFERENCE TO RELATED APPLICATION

Pursuant to 35 U.S.C. §119(e), this application claims priority to U.S. Provisional Application Ser. No. 61/086,977, filed Aug. 7, 2008, the contents of which are hereby incorporated by reference.

TECHNICAL FIELD

This disclosure relates to novel photoactive polymers, as well as related components, articles, systems, and methods.

BACKGROUND

Photovoltaic cells are commonly used to transfer energy in the form of light into energy in the form of electricity. A typical photovoltaic cell includes a photoactive material disposed between two electrodes. Generally, light passes through one or both of the electrodes to interact with the photoactive material, thereby generating charge carriers (i.e., electrons and holes). As a result, the ability of the photoactive material to absorb light and general charge carriers can limit the overall efficiency of a photovoltaic cell.

SUMMARY

This disclosure relates to novel photoactive polymers, as well as related components, articles, systems, and methods.

In one aspect, this disclosure features a polymer that includes first, second, and third comonomer repeat units. The first comonomer repeat unit includes a silacyclopentadithiophene moiety. The second comonomer repeat unit includes a cyclopentadithiophene moiety. The third comonomer repeat unit includes a benzothiadiazole moiety.

In another aspect, this disclosure features an article that includes a first electrode, a second electrode, and a photoactive material between the first and second electrodes. The photoactive material includes the polymer described above. The article is configured as a photovoltaic cell.

In another aspect, this disclosure features an article that includes a first electrode, a second electrode, and a photoactive material between the first and second electrodes. The photoactive material includes a polymer containing first, second, and third comonomer repeat units. The molar ratio of the first and second comonomer repeat units is at most about 5:1. The article is configured as a photovoltaic cell.

In still another aspect, this disclosure features a system that includes first and second electrodes, and first and second photoactive layers between the first and second electrodes. At least one of the first and second photoactive layers includes the polymer described above. The system is configured as a photovoltaic system.

Embodiments can include one or more of the following features.

In some embodiments, the molar ratio of the first and second comonomer repeat units is at most about 10:1 and/or at least about 1:1 (e.g., about 3:1).

In some embodiments, the first comonomer repeat unit includes a silacyclopentadithiophene moiety of formula (1):

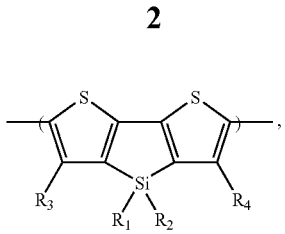

(1)

in which each of $R_1$, $R_2$, $R_3$, and $R_4$, independently, is H, $C_1$-$C_{20}$ alkyl, $C_1$-$C_{20}$ alkoxy, $C_3$-$C_{20}$ cycloalkyl, $C_1$-$C_{20}$ heterocycloalkyl, aryl, heteroaryl, halo, CN, OR, C(O)R, C(O)OR, or $SO_2R$; R being H, $C_1$-$C_{20}$ alkyl, $C_1$-$C_{20}$ alkoxy, aryl, heteroaryl, $C_3$-$C_{20}$ cycloalkyl, or $C_1$-$C_{20}$ heterocycloalkyl. For example, each of $R_1$ and $R_2$, independently, is $C_1$-$C_{20}$ alkyl (e.g., 2-ethylhexyl).

In some embodiments, the second comonomer repeat unit includes a cyclopentadithiophene moiety of formula (2):

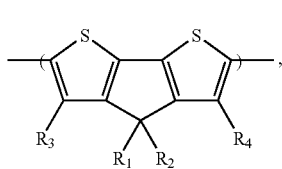

(2)

in which each of $R_1$, $R_2$, $R_3$, and $R_4$, independently, is H, $C_1$-$C_{20}$ alkyl, $C_1$-$C_{20}$ alkoxy, $C_3$-$C_{20}$ cycloalkyl, $C_1$-$C_{20}$ heterocycloalkyl, aryl, heteroaryl, halo, CN, OR, C(O)R, C(O)OR, or $SO_2R$; R being H, $C_1$-$C_{20}$ alkyl, $C_1$-$C_{20}$ alkoxy, aryl, heteroaryl, $C_3$-$C_{20}$ cycloalkyl, or $C_1$-$C_{20}$ heterocycloalkyl. For example, each of $R_1$ and $R_2$, independently, is $C_1$-$C_{20}$ alkyl (e.g., 2-ethylhexyl).

In some embodiments, the third comonomer repeat unit includes a benzothiadiazole moiety of formula (3):

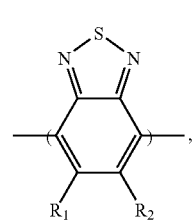

(3)

in which each of $R_1$ and $R_2$, independently, is H, $C_1$-$C_{20}$ alkyl, $C_1$-$C_{20}$ alkoxy, $C_3$-$C_{20}$ cycloalkyl, $C_1$-$C_{20}$ heterocycloalkyl, aryl, heteroaryl, halo, CN, OR, C(O)R, C(O)OR, or $SO_2R$; R being H, $C_1$-$C_{20}$ alkyl, $C_1$-$C_{20}$ alkoxy, aryl, heteroaryl, $C_3$-$C_{20}$ cycloalkyl, or $C_1$-$C_{20}$ heterocycloalkyl. For example, each of $R_1$ and $R_2$ is H.

In some embodiments, the article further includes an electron acceptor material. The electron acceptor material can include a material selected from the group consisting of fullerenes, inorganic nanoparticles, oxadiazoles, discotic liquid crystals, carbon nanorods, inorganic nanorods, polymers containing CN groups, polymers containing $CF_3$ groups, and combinations thereof. For example, the electron acceptor material can include a substituted fullerene, such as [6,6]-phenyl C61-butyric acid methyl ester (C61-PCBM) and [6,6]-phenyl C71-butyric acid methyl ester (C71-PCBM).

In some embodiments, the article has an efficiency of at least about 4% (e.g., at least about 5%) under AM 1.5 conditions.

In some embodiments, the polymer can be

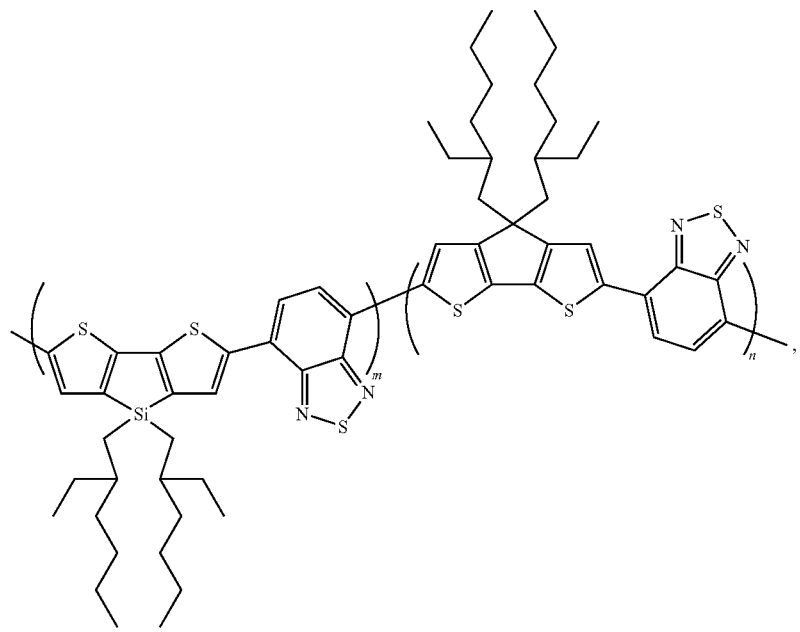

in which each of m and n, independently, is an integer greater than 1.

In some embodiments, the polymer can be either an electron donor material or an electron acceptor material.

In some embodiments, the photovoltaic cell can be a tandem photovoltaic cell.

Embodiments can provide one or more of the following advantages.

Without wishing to be bound by theory, it is believed that incorporating a silacyclopentadithiophene moiety into a photoactive polymer could significantly improve the solubility and processibility of the polymer and the morphology of a photoactive layer prepared from such a polymer, thereby increasing the efficiency of a photovoltaic cell.

Without wishing to be bound by theory, it is believed that incorporating a silacyclopentadithiophene moiety into a photoactive polymer can shift the absorption wavelength of the polymer toward the red and near IR portion (e.g., 650-900 nm) of the electromagnetic spectrum, which is not accessible by most other polymers. When such a co-polymer is incorporated into a photovoltaic cell, it enables the cell to absorb the light in this region of the spectrum, thereby increasing the current and efficiency of the cell.

Without wishing to be bound by theory, it is believed that a photovoltaic cell having a photoactive polymer containing the first, second, third comonomer repeat units described herein can have a high efficiency. In some embodiments, such a photovoltaic cell can have an efficiency of at least about 4% (e.g., at least about 5% or at least about 6%) under AM 1.5 conditions.

Without wishing to be bound by theory, it is believed that a photoactive polymer containing the first, second third comonomer repeat units described herein have improved solubility in an organic solvent (e.g., chlorobenzene) and provide an organic photovoltaic cell with increased fill factors and photocurrent than a polymer containing only first and third comonomer repeat units or second and third comonomer repeat units.

Without wishing to be bound by theory, it is believed that other advantages of the photoactive polymers described herein can include suitable band gap (e.g., 1.4-1.6 eV) that can improve photocurrent and cell voltage and high positive charge mobility (e.g., $10^{-4}$ to $10^{-1}$ cm$^2$/Vs) that can facilitate charge separation in a photoactive layer.

Other features and advantages of the invention will be apparent from the description, drawings, and claims.

DESCRIPTION OF DRAWINGS

Like reference symbols in the various drawings indicate like elements.

DETAILED DESCRIPTION

Figure 1:
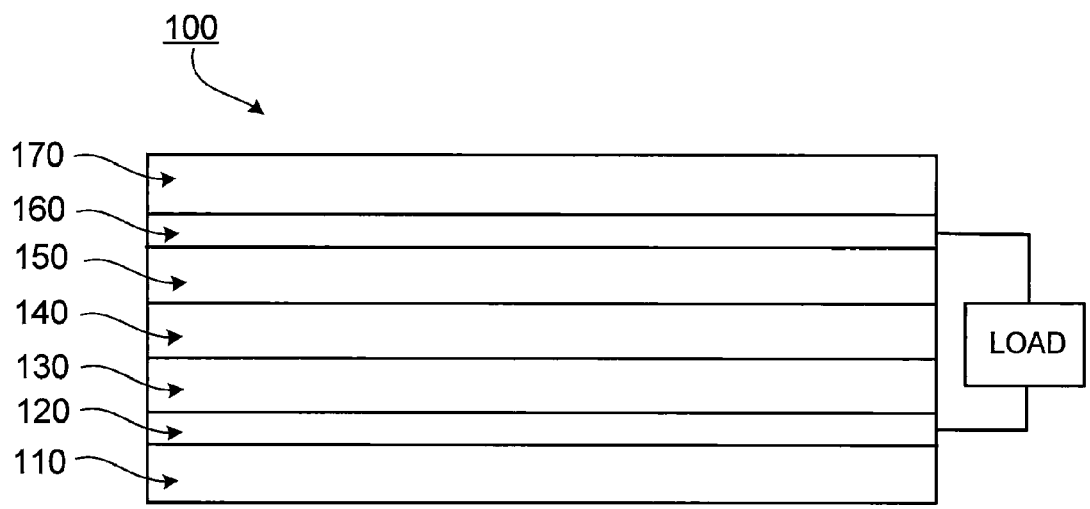
FIG. 1 is a cross-sectional view of an embodiment of a photovoltaic cell.

FIG. 1 shows a cross-sectional view of a photovoltaic cell 100 that includes a substrate 110, an electrode 120, an optional hole blocking layer 130, a photoactive layer 140 (containing an electron acceptor material and an electron donor material), a hole carrier layer 150, an electrode 160, and a substrate 170.

In general, during use, light impinges on the surface of substrate 110, and passes through substrate 110, electrode 120, and optional hole blocking layer 130. The light then interacts with photoactive layer 140, causing electrons to be transferred from the electron donor material (e.g., a polymer described above) to the electron acceptor material (e.g., C61-PCBM). The electron acceptor material then transmits the electrons through hole blocking layer 130 to electrode 120, and the electron donor material transfers holes through hole carrier layer 150 to electrode 160. Electrodes 120 and 160 are in electrical connection via an external load so that electrons pass from electrode 120, through the load, and to electrode 160.

In some embodiments, the electron donor or acceptor materials can include one or more polymers (e.g., homopolymers or copolymers). A polymer mentioned herein includes at least two identical or different monomer repeat units (e.g., at least 5 monomer repeat units, at least 10 monomer repeat units, at least 50 monomer repeat units, at least 100 monomer repeat units, or at least 500 monomer repeat units). A homopolymer mentioned herein refers to a polymer that includes only one type of monomer repeat units. A copolymer mentioned herein refers to a polymer that includes at least two co-monomer repeat units with different chemical structures. The polymers can be photovoltaically active.

In some embodiments, electron donor or acceptor materials can include one or more of the following comonomer repeat units: a silacyclopentadithiophene moiety of formula (1), a cyclopentadithiophene moiety of formula (2), a benzothiadiazole moiety of formula (3), a thiadiazoloquinoxaline moiety of formula (4), a cyclopentadithiophene dioxide moiety of formula (5), a cyclopentadithiophene monoxide moiety of formula (6), a benzoisothiazole moiety of formula (7), a benzothiazole moiety of formula (8), a thiophene dioxide moiety of formula (9), a cyclopentadithiophene dioxide moiety of formula (10), a cyclopentadithiophene tetraoxide moiety of formula (11), a thienothiophene moiety of formula (12), a thienothiophene tetraoxide moiety of formula (13), a dithienothiophene moiety of formula (14), a dithienothiophene dioxide moiety of formula (15), a dithienothiophene tetraoxide moiety of formula (16), a tetrahydroisoindole moiety of formula (17), a thienothiophene dioxide moiety of formula (18), a dithienothiophene dioxide moiety of formula (19), a fluorene moiety of formula (20), a silole moiety of formula (21), a fluorenone moiety of formula (22), a thiazole moiety of formula (23), a selenophene moiety of formula (24), a thiazolothiazole moiety of formula (25), a cyclopentadithiazole moiety of formula (26), a naphthothiadiazole moiety of formula (27), a thienopyrazine moiety of formula (28), an oxazole moiety of formula (29), an imidazole moiety of formula (30), a pyrimidine moiety of formula (31), a benzoxazole moiety of formula (32), a benzimidazole moiety of formula (33), or a benzooxadiazole moiety of formula (34):

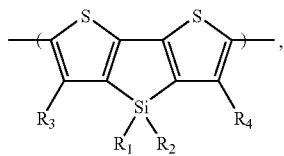

(1)

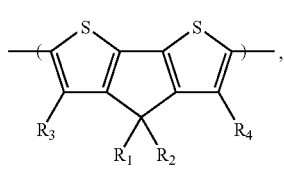

(2)

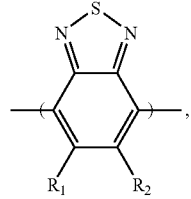

(3)

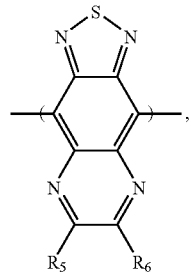

(4)

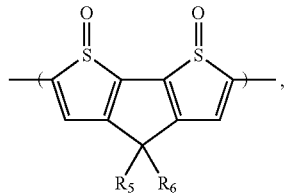

(5)

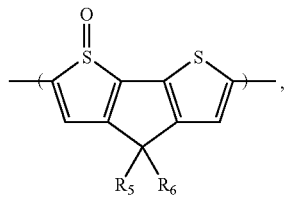

(6)

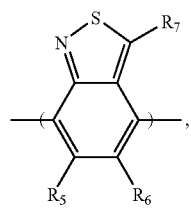

(7)

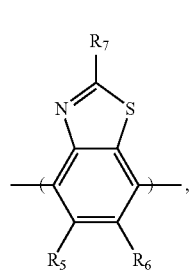

(8)

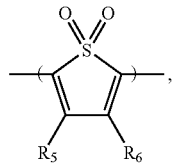

(9)

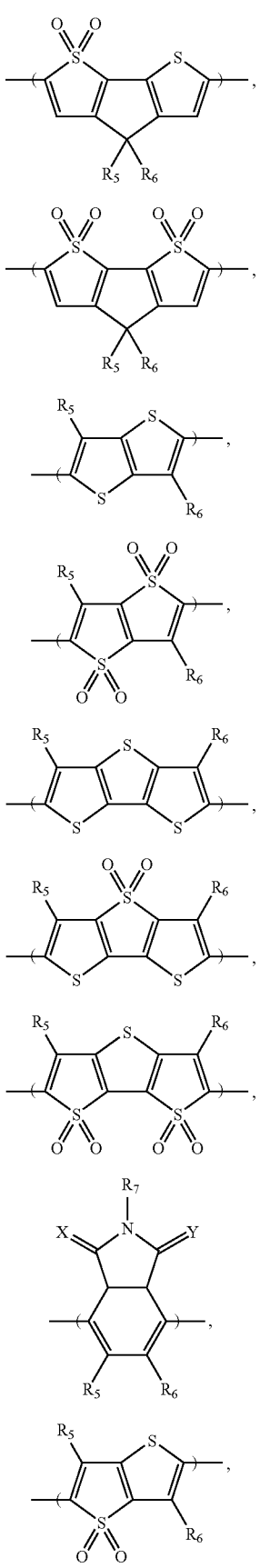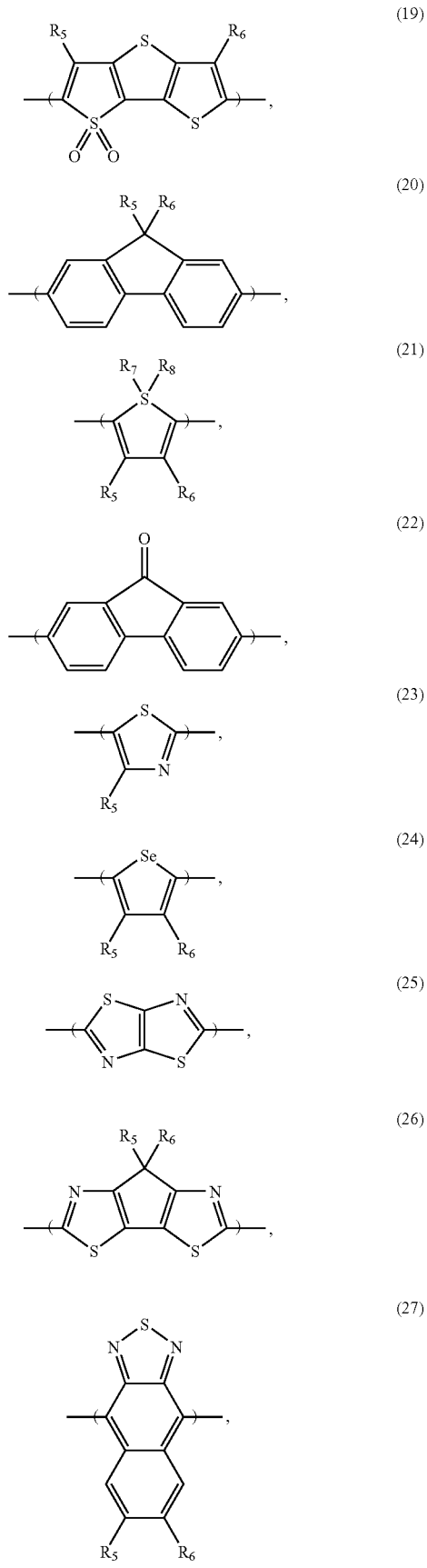

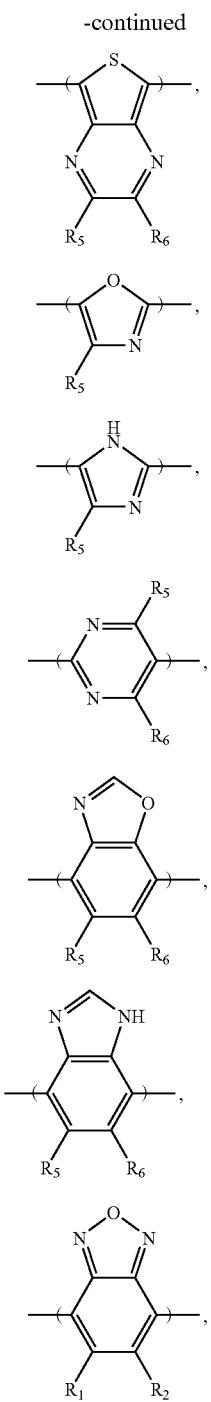

In the above formulas, each of X and Y, independently, can be $CH_2$, O, or S; each of $R_1$, $R_2$, $R_3$, $R_4$, $R_5$, and $R_6$, independently, can be H, $C_1$-$C_{20}$ alkyl, $C_1$-$C_{20}$ alkoxy, $C_3$-$C_{20}$ cycloalkyl, $C_1$-$C_{20}$ heterocycloalkyl, aryl, heteroaryl, halo, CN, OR, C(O)R, C(O)OR, or $SO_2R$, in which R is H, $C_1$-$C_{20}$ alkyl, $C_1$-$C_{20}$ alkoxy, aryl, heteroaryl, $C_3$-$C_{20}$ cycloalkyl, or $C_1$-$C_{20}$ heterocycloalkyl; and each of $R_7$ and $R_8$, independently, can be H, $C_1$-$C_{20}$ alkyl, $C_1$-$C_{20}$ alkoxy, aryl, heteroaryl, $C_3$-$C_{20}$ cycloalkyl, or $C_1$-$C_{20}$ heterocycloalkyl.

An alkyl can be saturated or unsaturated and branched or straight chained. A $C_1$-$C_{20}$ alkyl contains 1 to 20 carbon atoms (e.g., one, two, three, four, five, six, seven, eight, nine, 10, 11, 12, 13, 14, 15, 16, 17, 18, 19, and 20 carbon atoms). Examples of alkyl moieties include —$CH_3$, —$CH_2$—, —$CH_2$=$CH_2$—, —$CH_2$—CH=$CH_2$, and branched —$C_3H_7$. An alkoxy can be branched or straight chained and saturated or unsaturated. An $C_1$-$C_{20}$ alkoxy contains an oxygen radical and 1 to 20 carbon atoms (e.g., one, two, three, four, five, six, seven, eight, nine, 10, 11, 12, 13, 14, 15, 16, 17, 18, 19, and 20 carbon atoms). Examples of alkoxy moieties include —$OCH_3$ and —OCH=CH—$CH_3$. A cycloalkyl can be either saturated or unsaturated. A $C_3$-$C_{20}$ cycloalkyl contains 3 to 20 carbon atoms (e.g., three, four, five, six, seven, eight, nine, 10, 11, 12, 13, 14, 15, 16, 17, 18, 19, and 20 carbon atoms). Examples of cycloalkyl moieties include cyclohexyl and cyclohexen-3-yl. A heterocycloalkyl can also be either saturated or unsaturated. A $C_1$-$C_{20}$ heterocycloalkyl contains at least one ring heteroatom (e.g., O, N, and S) and 1 to 20 carbon atoms (e.g., one, two, three, four, five, six, seven, eight, nine, 10, 11, 12, 13, 14, 15, 16, 17, 18, 19, and 20 carbon atoms). Examples of heterocycloalkyl moieties include 4-tetrahydropyranyl and 4-pyranyl. An aryl can contain one or more aromatic rings. Examples of aryl moieties include phenyl, phenylene, naphthyl, naphthylene, pyrenyl, anthryl, and phenanthryl. A heteroaryl can contain one or more aromatic rings, at least one of which contains at least one ring heteroatom (e.g., O, N, and S). Examples of heteroaryl moieties include furyl, furylene, fluorenyl, pyrrolyl, thienyl, oxazolyl, imidazolyl, thiazolyl, pyridyl, pyrimidinyl, quinazolinyl, quinolyl, isoquinolyl, and indolyl.

Alkyl, alkoxy, cycloalkyl, heterocycloalkyl, aryl, and heteroaryl mentioned herein include both substituted and unsubstituted moieties, unless specified otherwise. Examples of substituents on cycloalkyl, heterocycloalkyl, aryl, and heteroaryl include $C_1$-$C_{20}$ alkyl, $C_3$-$C_{20}$ cycloalkyl, $C_1$-$C_{20}$ alkoxy, aryl, aryloxy, heteroaryl, heteroaryloxy, amino, $C_1$-$C_{10}$ alkylamino, $C_1$-$C_{20}$ dialkylamino, arylamino, diarylamino, hydroxyl, halogen, thio, $C_1$-$C_{10}$ alkylthio, arylthio, $C_1$-$C_{10}$ alkylsulfonyl, arylsulfonyl, cyano, nitro, acyl, acyloxy, carboxyl, and carboxylic ester. Examples of substituents on alkyl include all of the above-recited substituents except $C_1$-$C_{20}$ alkyl. Cycloalkyl, heterocycloalkyl, aryl, and heteroaryl also include fused groups.

In some embodiments, the electron donor or acceptor material can be a copolymer that includes first, second, and third comonomer repeat units, in which the first comonomer repeat unit includes a silacyclopentadithiophene moiety, the second comonomer repeat unit includes a cyclopentadithiophene moiety, and the third comonomer repeat unit includes a benzothiadiazole moiety.

In some embodiments, the first comonomer repeat unit includes a silacyclopentadithiophene moiety of formula (1):

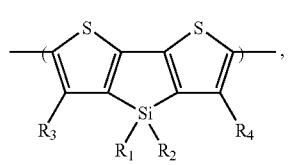

(1)

in which each of $R_1$, $R_2$, $R_3$, and $R_4$, independently, can be H, $C_1$-$C_{20}$ alkyl, $C_1$-$C_{20}$ alkoxy, $C_3$-$C_{20}$ cycloalkyl, $C_1$-$C_{20}$ heterocycloalkyl, aryl, heteroaryl, halo, CN, OR, C(O)R, C(O)OR, or $SO_2R$; R being H, $C_1$-$C_{20}$ alkyl, $C_1$-$C_{20}$ alkoxy, aryl, heteroaryl, $C_3$-$C_{20}$ cycloalkyl, or $C_1$-$C_{20}$ heterocycloalkyl. In certain embodiments, each of $R_1$ and $R_2$, independently, is $C_1$-$C_{20}$ alkyl (e.g., 2-ethylhexyl).

In some embodiments, the second comonomer repeat unit includes a cyclopentadithiophene moiety of formula (2):

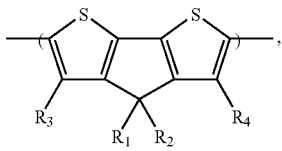
(2)

in which each of $R_1$, $R_2$, $R_3$, and $R_4$, independently, can be H, $C_1$-$C_{20}$ alkyl, $C_1$-$C_{20}$ alkoxy, $C_3$-$C_{20}$ cycloalkyl, $C_1$-$C_{20}$ heterocycloalkyl, aryl, heteroaryl, halo, CN, OR, C(O)R, C(O)OR, or $SO_2R$; R being H, $C_1$-$C_{20}$ alkyl, $C_1$-$C_{20}$ alkoxy, aryl, heteroaryl, $C_3$-$C_{20}$ cycloalkyl, or $C_1$-$C_{20}$ heterocycloalkyl. In certain embodiments, each of $R_1$ and $R_2$, independently, is $C_1$-$C_{20}$ alkyl (e.g., 2-ethylhexyl).

In some embodiments, the third comonomer repeat unit includes a benzothiadiazole moiety of formula (3):

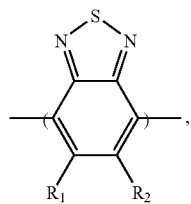
(3)

in which each of $R_1$ and $R_2$, independently, can be H, $C_1$-$C_{20}$ alkyl, $C_1$-$C_{20}$ alkoxy, $C_3$-$C_{20}$ cycloalkyl, $C_1$-$C_{20}$ heterocycloalkyl, aryl, heteroaryl, halo, CN, OR, C(O)R, C(O)OR, or $SO_2R$; R being H, $C_1$-$C_{20}$ alkyl, $C_1$-$C_{20}$ alkoxy, aryl, heteroaryl, $C_3$-$C_{20}$ cycloalkyl, or $C_1$-$C_{20}$ heterocycloalkyl. In certain embodiments, each of $R_1$ and $R_2$ is H.

Without wishing to be bound by theory, it is believed that incorporating a silacyclopentadithiophene moiety of formula (1) into a photoactive polymer could significantly improve the solubility and processibility of the polymer and the morphology of a photoactive layer prepared from such a polymer, thereby increasing the efficiency of a photovoltaic cell. Further, without wishing to be bound theory, it is believed that incorporating a silacyclopentadithiophene moiety into a photoactive polymer can shift the absorption wavelength of the polymer toward the red and near IR portion (e.g., 650-900 nm) of the electromagnetic spectrum, which is not accessible by most other polymers. When such a co-polymer is incorporated into a photovoltaic cell, it enables the cell to absorb the light in this region of the spectrum, thereby increasing the current and efficiency of the cell. For example, replacing a photoactive polymer having co-monomer repeat units of formulas (2) and (3) with a photoactive polymer having co-monomer repeat units of formulas (1), (2), and (3) can increase the efficiency of a photovoltaic cell from about 3% to about 5% under the AM 1.5 conditions.

In general, the molar ratio of the comonomer repeat units in the polymer can vary as desired. In some embodiments, the molar ratio of the first and second comonomer repeat units is at least about 1:1 (e.g., at least about 2:1, at least about 3:1, or at least 4:1) and/or at most about 10:1 (e.g., at most about 5:1, at most about 4:1, at most about 3:1, or at most about 2:1). Without wishing to be bound by theory, it is believed that, when the molar ratio of the first and second comonomer repeat units is above about 5:1, it can be difficult to process the resultant polymer to form a coating on a substrate, which can adversely affect the morphology of the photoactive polymer and lower the efficiency of a photovoltaic cell. Further, without wishing to be bound by theory, it is believed that, when the molar ratio of the first and second comonomer repeat units is less than about 1:1, a photovoltaic cell containing such a polymer may not have sufficient efficiency during operation.

An exemplary polymer that can be used in the photoactive layer 140 is

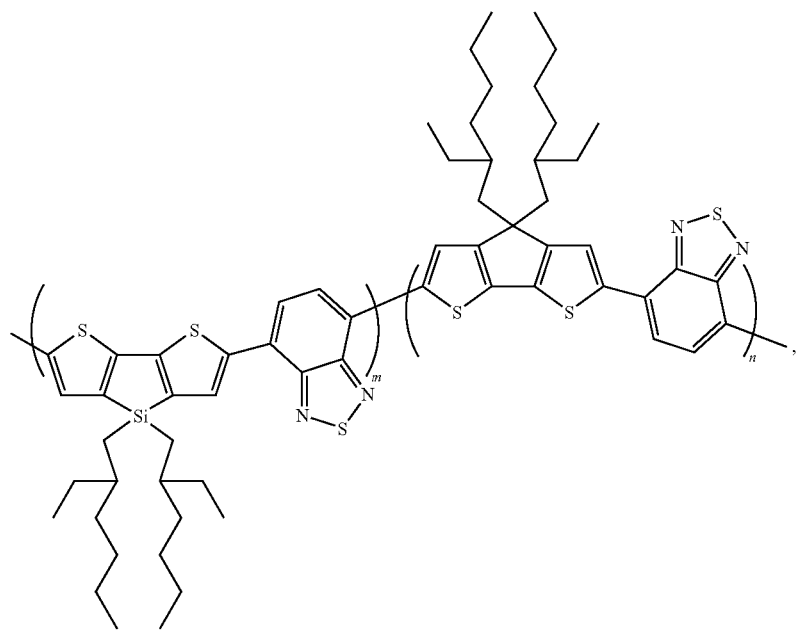

in which each of m and n, independently, is an integer greater than 1 (e.g., 2, 3, 5, 10, 20, 50, or 100). This polymer can have superior processability (e.g., in a solution coating process) and can be used to prepare a photovoltaic cell having an efficiency at least about 5% under AM 1.5 conditions. It can be prepared by the methods described in Examples 1-3 below.

Without wishing to be bound by theory, it is believed that a photovoltaic cell having a photoactive polymer containing the first, second, third comonomer repeat units described above can have a high efficiency. In some embodiments, such a photovoltaic cell can have an efficiency of at least about 4% (e.g., at least about 5% or at least about 6%) under AM 1.5 conditions. Further, without wishing to be bound by theory, it is believed that other advantages of the polymers described above include suitable band gap (e.g., 1.4-1.6 eV) that can improve photocurrent and cell voltage, high positive charge mobility (e.g., $10^{-4}$ to $10^{-1}$ cm$^2$/Vs) that can facilitate charge separation in photoactive layer 140, and high solubility in an organic solvent that can improve film forming ability and processability. In some embodiments, the polymers can be optically non-scattering.

The polymers described above can be prepared by methods known in the art. For example, a copolymer can be prepared by a cross-coupling reaction between one or more comonomers containing two organometallic groups (e.g., alkylstannyl groups, Grignard groups, or alkylzinc groups) and one or more comonomers containing two halo groups (e.g., Cl, Br, or I) in the presence of a transition metal catalyst. As another example, a copolymer can be prepared by a cross-coupling reaction between one or more comonomers containing two borate groups and one or more comonomers containing two halo groups (e.g., Cl, Br, or I) in the presence of a transition metal catalyst. Other methods that can be used to prepare the copolymers described above including Suzuki coupling reactions, Negishi coupling reactions, Kumada coupling reactions, and Stille coupling reactions, all of which are well known in the art.

The comonomers can be prepared by the methods described herein or by the methods know in the art, such as those described in U.S. patent application Ser. No. 11/486, 536, Coppo et al., *Macromolecules* 2003, 36, 2705-2711 and Kurt et al., *J. Heterocycl. Chem.* 1970, 6, 629, the contents of which are hereby incorporated by reference. The comonomers can contain a non-aromatic double bond and one or more asymmetric centers. Thus, they can occur as racemates and racemic mixtures, single enantiomers, individual diastereomers, diastereomeric mixtures, and cis- or trans-isomeric forms. All such isomeric forms are contemplated.

In some embodiments, electron acceptor materials of photoactive layer 140 can include fullerenes. In some embodiments, photoactive layer 140 can include one or more unsubstituted fullerenes and/or one or more substituted fullerenes. Examples of unsubstituted fullerenes include $C_{60}$, $C_{70}$, $C_{76}$, $C_{78}$, $C_{82}$, $C_{84}$, and $C_{92}$. Examples of substituted fullerenes include PCBMs or fullerenes substituted with $C_1$-$C_{20}$ alkoxy optionally further substituted with $C_1$-$C_{20}$ alkoxy and/or halo (e.g., $(OCH_2CH_2)_2OCH_3$ or $OCH_2CF_2OCF_2CF_2OCF_3$). Without wishing to be bound by theory, it is believed that fullerenes substituted with long-chain alkoxy groups (e.g., oligomeric ethylene oxides) or fluorinated alkoxy groups have improved solubility in organic solvents and can form a photoactive layer with improved morphology. In some embodiments, the electron acceptor material can include one or more of the polymers described above. In certain embodiments, a combination of electron acceptor materials can be used in photoactive layer 140.

Turning to other components of photovoltaic cell 100, substrate 110 is generally formed of a transparent material. As referred to herein, a transparent material is a material which, at the thickness used in a photovoltaic cell 100, transmits at least about 60% (e.g., at least about 70%, at least about 75%, at least about 80%, at least about 85%) of incident light at a wavelength or a range of wavelengths used during operation of the photovoltaic cell. Exemplary materials from which substrate 110 can be formed include polyethylene terephthalates, polyimides, polyethylene naphthalates, polymeric hydrocarbons, cellulosic polymers, polycarbonates, polyamides, polyethers, and polyether ketones. In certain embodiments, the polymer can be a fluorinated polymer. In some embodiments, combinations of polymeric materials are used. In certain embodiments, different regions of substrate 110 can be formed of different materials.

In general, substrate 110 can be flexible, semi-rigid or rigid (e.g., glass). In some embodiments, substrate 110 has a flexural modulus of less than about 5,000 megaPascals (e.g., less than about 1,000 megaPascals or less than about 5,00 megaPascals). In certain embodiments, different regions of substrate 110 can be flexible, semi-rigid, or inflexible (e.g., one or more regions flexible and one or more different regions semi-rigid, one or more regions flexible and one or more different regions inflexible).

Typically, substrate 110 is at least about one micron (e.g., at least about five microns, at least about 10 microns) thick and/or at most about 1,000 microns (e.g., at most about 500 microns thick, at most about 300 microns thick, at most about 200 microns thick, at most about 100 microns, at most about 50 microns) thick.

Generally, substrate 110 can be colored or non-colored. In some embodiments, one or more portions of substrate 110 is/are colored while one or more different portions of substrate 110 is/are non-colored.

Substrate 110 can have one planar surface (e.g., the surface on which light impinges), two planar surfaces (e.g., the surface on which light impinges and the opposite surface), or no planar surfaces. A non-planar surface of substrate 110 can, for example, be curved or stepped. In some embodiments, a non-planar surface of substrate 110 is patterned (e.g., having patterned steps to form a Fresnel lens, a lenticular lens or a lenticular prism).

Electrode 120 is generally formed of an electrically conductive material. Exemplary electrically conductive materials include electrically conductive metals, electrically conductive alloys, electrically conductive polymers, and electrically conductive metal oxides. Exemplary electrically conductive metals include gold, silver, copper, aluminum, nickel, palladium, platinum, and titanium. Exemplary electrically conductive alloys include stainless steel (e.g., 332 stainless steel, 316 stainless steel), alloys of gold, alloys of silver, alloys of copper, alloys of aluminum, alloys of nickel, alloys of palladium, alloys of platinum and alloys of titanium. Exemplary electrically conducting polymers include polythiophenes (e.g., doped poly(3,4-ethylenedioxythiophene) (doped PEDOT)), polyanilines (e.g., doped polyanilines), polypyrroles (e.g., doped polypyrroles). Exemplary electrically conducting metal oxides include indium tin oxide, fluorinated tin oxide, tin oxide and zinc oxide. In some embodiments, combinations of electrically conductive materials are used.

In some embodiments, electrode 120 can include a mesh electrode. Examples of mesh electrodes are described in co-pending U.S. Patent Application Publication Nos. 20040187911 and 20060090791, the entire contents of which are hereby incorporated by reference.

In some embodiments, a combination of the materials described above can be used to in electrode 120.

Optionally, photovoltaic cell 100 can include a hole blocking layer 130. The hole blocking layer is generally formed of a material that, at the thickness used in photovoltaic cell 100, transports electrons to electrode 120 and substantially blocks the transport of holes to electrode 120. Examples of materials from which the hole blocking layer can be formed include LiF, metal oxides (e.g., zinc oxide, titanium oxide), and amines (e.g., primary, secondary, or tertiary amines). Examples of amines suitable for use in a hole blocking layer have been described, for example, in co-pending U.S. Provisional Application Ser. No. 60/926,459, the entire contents of which are hereby incorporated by reference.

Without wishing to be bound by theory, it is believed that when photovoltaic cell 100 includes a hole blocking layer made of amines, the hole blocking layer can facilitate the formation of ohmic contact between photoactive layer 140 and electrode 120 without being exposed to UV light, thereby reducing damage to photovoltaic cell 100 resulted from UV exposure.

Typically, hole blocking layer 130 is at least 0.02 micron (e.g., at least about 0.03 micron, at least about 0.04 micron, at least about 0.05 micron) thick and/or at most about 0.5 micron (e.g., at most about 0.4 micron, at most about 0.3 micron, at most about 0.2 micron, at most about 0.1 micron) thick.

Hole carrier layer 150 is generally formed of a material that, at the thickness used in photovoltaic cell 100, transports holes to electrode 160 and substantially blocks the transport of electrons to electrode 160. Examples of materials from which layer 130 can be formed include polythiophenes (e.g., PEDOT), polyanilines, polycarbazoles, polyvinylcarbazoles, polyphenylenes, polyphenylvinylenes, polysilanes, polythienylenevinylenes, polyisothianaphthanenes, and copolymers thereof. In some embodiments, hole carrier layer 150 can include a dopant used in combination with a semiconductive polymer. Examples of dopants include poly(styrene-sulfonate)s, polymeric sulfonic acids, or fluorinated polymers (e.g., fluorinated ion exchange polymers).

In some embodiments, the materials that can be used to form hole carrier layer 150 include metal oxides, such as titanium oxides, zinc oxides, tungsten oxides, molybdenum oxides, copper oxides, strontium copper oxides, or strontium titanium oxides. The metal oxides can be either undoped or doped with a dopant. Examples of dopants for metal oxides includes salts or acids of fluoride, chloride, bromide, and iodide.

In some embodiments, the materials that can be used to form hole carrier layer 150 include carbon allotropes (e.g., carbon nanotubes). The carbon allotropes can be embedded in a polymer binder.

In some embodiments, the hole carrier materials can be in the form of nanoparticles. The nanoparticles can have any suitable shape, such as a spherical, cylindrical, or rod-like shape.

In some embodiments, hole carrier layer 150 can include combinations of hole carrier materials described above.

In general, the thickness of hole carrier layer 150 (i.e., the distance between the surface of hole carrier layer 150 in contact with photoactive layer 140 and the surface of electrode 160 in contact with hole carrier layer 150) can be varied as desired. Typically, the thickness of hole carrier layer 150 is at least 0.01 micron (e.g., at least about 0.05 micron, at least about 0.1 micron, at least about 0.2 micron, at least about 0.3 micron, or at least about 0.5 micron) and/or at most about five microns (e.g., at most about three microns, at most about two microns, or at most about one micron). In some embodiments, the thickness of hole carrier layer 150 is from about 0.01 micron to about 0.5 micron.

Electrode 160 is generally formed of an electrically conductive material, such as one or more of the electrically conductive materials described above. In some embodiments, electrode 160 is formed of a combination of electrically conductive materials. In certain embodiments, electrode 160 can be formed of a mesh electrode.

Substrate 170 can be identical to or different from substrate 110. In some embodiments, substrate 170 can be formed of one or more suitable polymers, such as the polymers used in substrate 110 described above.

Figure 2:
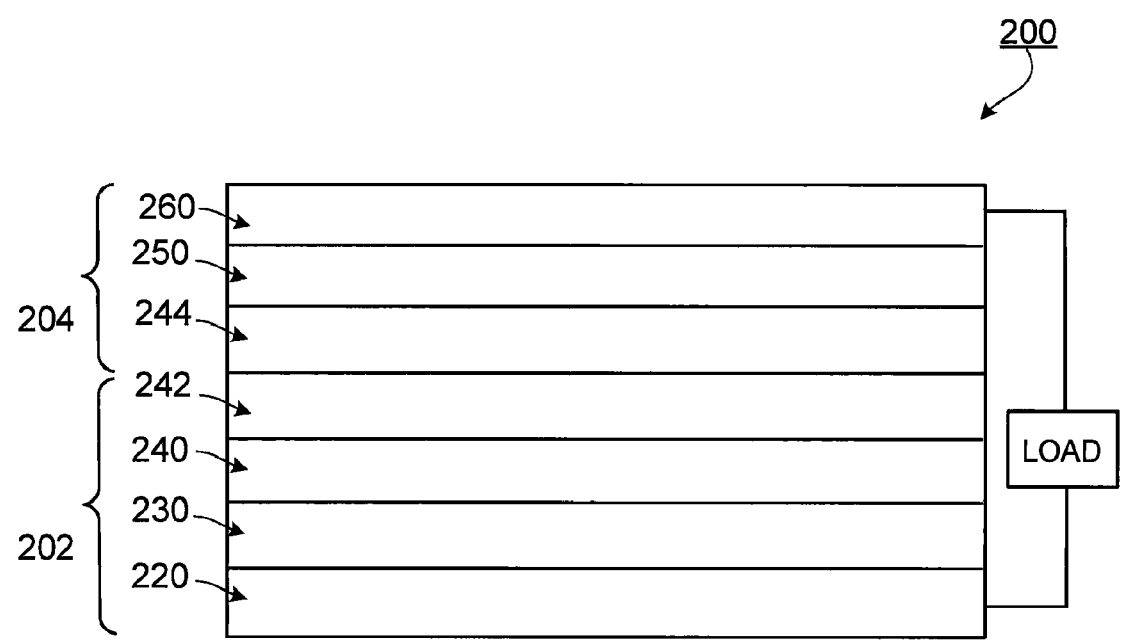
FIG. 2 is a cross-sectional view of an embodiment of a tandem photovoltaic cell.

In some embodiments, the polymers described above can be used as an electron donor material or an electro acceptor material in a system in which two photovoltaic cells share a common electrode. Such a system is also known as tandem photovoltaic cell. FIG. 2 shows a tandem photovoltaic cell 200 having two semi-cells 202 and 204. Semi-cell 202 includes an electrode 220, an optional hole blocking layer 230, a first photoactive layer 240, and a recombination layer 242. Semi-cell 204 includes recombination layer 242, a second photoactive layer 244, a hole carrier layer 250, and an electrode 260. An external load is connected to photovoltaic cell 200 via electrodes 220 and 260.

Depending on the production process and the desired device architecture, the current flow in a semi-cell can be reversed by changing the electron/hole conductivity of a certain layer (e.g., changing hole blocking layer 230 to a hole carrier layer). By doing so, a tandem cell can be designed such that the semi-cells in the tandem cells can be electrically interconnected either in series or in parallel.

A recombination layer refers to a layer in a tandem cell where the electrons generated from a first semi-cell recombine with the holes generated from a second semi-cell. Recombination layer 242 typically includes a p-type semiconductor material and an n-type semiconductor material. In general, n-type semiconductor materials selectively transport electrons and p-type semiconductor materials selectively transport holes. As a result, electrons generated from the first semi-cell recombine with holes generated from the second semi-cell at the interface of the n-type and p-type semiconductor materials.

In some embodiments, the p-type semiconductor material includes a polymer and/or a metal oxide. Examples p-type semiconductor polymers include polythiophenes (e.g., poly (3,4-ethylene dioxythiophene) (PEDOT)), polyanilines, polyvinylcarbazoles, polyphenylenes, polyphenylvinylenes, polysilanes, polythienylenevinylenes, polyisothianaphthanenes, polycyclopentadithiophenes, polysilacyclopentadithiophenes, polycyclopentadithiazoles, polythiazolothiazoles, polythiazoles, polybenzothiadiazoles, poly(thiophene oxide)s, poly(cyclopentadithiophene oxide)s, polythiadiazoloquinoxaline, polybenzoisothiazole, polybenzothiazole, polythienothiophene, poly(thienothiophene oxide), polydithienothiophene, poly(dithienothiophene oxide)s, polytetrahydroisoindoles, and copolymers thereof. The metal oxide can be an intrinsic p-type semiconductor (e.g., copper oxides, strontium copper oxides, or strontium titanium oxides) or a metal oxide that forms a p-type semiconductor after doping with a dopant (e.g., p-doped zinc oxides or p-doped titanium oxides). Examples of dopants includes salts or acids of fluoride, chloride, bromide, and iodide. In some embodiments, the metal oxide can be used in the form of nanoparticles.

In some embodiments, the n-type semiconductor material (either an intrinsic or doped n-type semiconductor material) includes a metal oxide, such as titanium oxides, zinc oxides, tungsten oxides, molybdenum oxides, and combinations thereof. The metal oxide can be used in the form of nanoparticles. In other embodiments, the n-type semiconductor material includes a material selected from the group consisting of fullerenes, inorganic nanoparticles, oxadiazoles, discotic liquid crystals, carbon nanorods, inorganic nanorods, polymers containing CN groups, polymers containing $CF_3$ groups, and combinations thereof.

In some embodiments, the p-type and n-type semiconductor materials are blended into one layer. In certain embodiments, recombination layer 242 includes two layers, one layer including the p-type semiconductor material and the other layer including the n-type semiconductor material. In such embodiments, recombination layer 242 can include a layer of mixed n-type and p-type semiconductor materials at the interface of the two layers.

In some embodiments, recombination layer 242 includes at least about 30 wt % (e.g., at least about 40 wt % or at least about 50 wt %) and/or at most about 70 wt % (e.g., at most about 60 wt % or at most about 50 wt %) of the p-type semiconductor material. In some embodiments, recombination layer 242 includes at least about 30 wt % (e.g., at least about 40 wt % or at least about 50 wt %) and/or at most about 70 wt % (e.g., at most about 60 wt % or at most about 50 wt %) of the n-type semiconductor material.

Recombination layer 242 generally has a sufficient thickness so that the layers underneath are protected from any solvent applied onto recombination layer 242. In some embodiments, recombination layer 242 can have a thickness at least about 10 nm (e.g., at least about 20 nm, at least about 50 nm, or at least about 100 nm) and/or at most about 500 nm (e.g., at most about 200 nm, at most about 150 nm, or at most about 100 nm).

In general, recombination layer 242 is substantially transparent. For example, at the thickness used in a tandem photovoltaic cell 200, recombination layer 242 can transmit at least about 70% (e.g., at least about 75%, at least about 80%, at least about 85%, or at least about 90%) of incident light at a wavelength or a range of wavelengths (e.g., from about 350 nm to about 1,000 nm) used during operation of the photovoltaic cell.

Recombination layer 242 generally has a sufficiently low surface resistance. In some embodiments, recombination layer 242 has a surface resistance of at most about $1\times10^6$ ohm/square (e.g., at most about $5\times10^5$ ohm/square, at most about $2\times10^5$ ohm/square, or at most about $1\times10^5$ ohm/square).

Without wishing to be bound by theory, it is believed that recombination layer 242 can be considered as a common electrode between two semi-cells (e.g., one including electrode 220, hole blocking layer 230, photoactive layer 240, and recombination layer 242, and the other include recombination layer 242, photoactive layer 244, hole carrier layer 250, and electrode 260) in photovoltaic cells 200. In some embodiments, recombination layer 242 can include an electrically conductive grid (e.g., mesh) material, such as those described above. An electrically conductive grid material can provide a selective contact of the same polarity (either p-type or n-type) to the semi-cells and provide a highly conductive but transparent layer to transport electrons to a load.

In some embodiments, recombination layer 242 can be prepared by applying a blend of an n-type semiconductor material and a p-type semiconductor material on a photoactive layer. For example, an n-type semiconductor and a p-type semiconductor can be first dispersed and/or dissolved in a solvent together to form a dispersion or solution, which can then be coated on a photoactive layer to form a recombination layer.

In some embodiments, a two-layer recombination layer can be prepared by applying a layer of an n-type semiconductor material and a layer of a p-type semiconductor material separately. For example, when titanium oxide nanoparticles are used as an n-type semiconductor material, a layer of titanium oxide nanoparticles can be formed by (1) dispersing a precursor (e.g., a titanium salt) in a solvent (e.g., an anhydrous alcohol) to form a dispersion, (2) coating the dispersion on a photoactive layer, (3) hydrolyzing the dispersion to form a titanium oxide layer, and (4) drying the titanium oxide layer. As another example, when a polymer (e.g., PEDOT) is used a p-type semiconductor, a polymer layer can be formed by first dissolving the polymer in a solvent (e.g., an anhydrous alcohol) to form a solution and then coating the solution on a photoactive layer.

Other components in tandem cell 200 can be formed of the same materials, or have the same characteristics, as those in photovoltaic cell 100 described above.

Other examples of tandem photovoltaic cells have been described in, for example, commonly owned co-pending U.S. Application Publication Nos. 2007-0181179 and 2007-0246094, the entire contents of which are hereby incorporated by reference.

In some embodiments, the semi-cells in a tandem cell are electrically interconnected in series. When connected in series, in general, the layers can be in the order shown in FIG. 2. In certain embodiments, the semi-cells in a tandem cell are electrically interconnected in parallel. When interconnected in parallel, a tandem cell having two semi-cells can include the following layers: a first electrode, a first hole blocking layer, a first photoactive layer, a first hole carrier layer (which can serve as an electrode), a second hole carrier layer (which can serve as an electrode), a second photoactive layer, a second hole blocking layer, and a second electrode. In such embodiments, the first and second hole carrier layers can be either two separate layers or can be one single layer. In case the conductivity of the first and second hole carrier layer is not sufficient, an additional layer (e.g., an electrically conductive mesh layer) providing the required conductivity may be inserted.

In some embodiments, a tandem cell can include more than two semi-cells (e.g., three, four, five, six, seven, eight, nine, ten, or more semi-cells). In certain embodiments, some semi-cells can be electrically interconnected in series and some semi-cells can be electrically interconnected in parallel.

In general, the methods of preparing each layer in photovoltaic cells described in FIGS. 1 and 2 can vary as desired. In some embodiments, a layer can be prepared by a liquid-based coating process. In certain embodiments, a layer can be prepared via a gas phase-based coating process, such as chemical or physical vapor deposition processes.

The term "liquid-based coating process" mentioned herein refers to a process that uses a liquid-based coating composition. Examples of the liquid-based coating composition include solutions, dispersions, or suspensions. The liquid-based coating process can be carried out by using at least one of the following processes: solution coating, ink jet printing, spin coating, dip coating, knife coating, bar coating, spray coating, roller coating, slot coating, gravure coating, flexographic printing, or screen printing. Examples of liquid-based coating processes have been described in, for example, commonly-owned co-pending U.S. Application Publication No. 2008-0006324, the entire contents of which are hereby incorporated by reference.

In some embodiments, when a layer includes inorganic semiconductor nanoparticles, the liquid-based coating process can be carried out by (1) mixing the nanoparticles with a solvent (e.g., an aqueous solvent or an anhydrous alcohol) to form a dispersion, (2) coating the dispersion onto a substrate, and (3) drying the coated dispersion. In certain embodiments, a liquid-based coating process for preparing a layer containing inorganic metal oxide nanoparticles can be carried out by (1) dispersing a precursor (e.g., a titanium salt) in a suitable solvent (e.g., an anhydrous alcohol) to form a dispersion, (2) coating the dispersion on a substrate, (3) hydrolyzing the dispersion to form an inorganic semiconductor nanoparticles layer (e.g., a titanium oxide nanoparticles layer), and (4) drying the inorganic semiconductor material layer. In certain embodiments, the liquid-based coating process can be carried out by a sol-gel process (e.g., by forming metal oxide nanoparticles as a sol-gel in a dispersion before coating the dispersion on a substrate).

In general, the liquid-based coating process used to prepare a layer containing an organic semiconductor material can be the same as or different from that used to prepare a layer containing an inorganic semiconductor material. In some embodiments, when a layer includes an organic semiconductor material, the liquid-based coating process can be carried out by mixing the organic semiconductor material with a solvent (e.g., an organic solvent) to form a solution or a dispersion, coating the solution or dispersion on a substrate, and drying the coated solution or dispersion.

In some embodiments, the photovoltaic cells described in FIGS. 1 and 2 can be prepared in a continuous manufacturing process, such as a roll-to-roll process, thereby significantly reducing the manufacturing cost. Examples of roll-to-roll processes have been described in, for example, commonly-owned co-pending U.S. Application Publication No. 2005-0263179, the entire contents of which are hereby incorporated by reference.

While certain embodiments have been disclosed, other embodiments are also possible.

In some embodiments, photovoltaic cell 100 includes a cathode as a bottom electrode and an anode as a top electrode. In some embodiments photovoltaic cell 100 can also include an anode as a bottom electrode and a cathode as a top electrode.

In some embodiments, photovoltaic cell 100 can include the layers shown in FIG. 1 in a reverse order. In other words, photovoltaic cell 100 can include these layers from the bottom to the top in the following sequence: a substrate 170, an electrode 160, a hole carrier layer 150, a photoactive layer 140, an optional hole blocking layer 130, an electrode 120, and a substrate 110.

Figure 3:
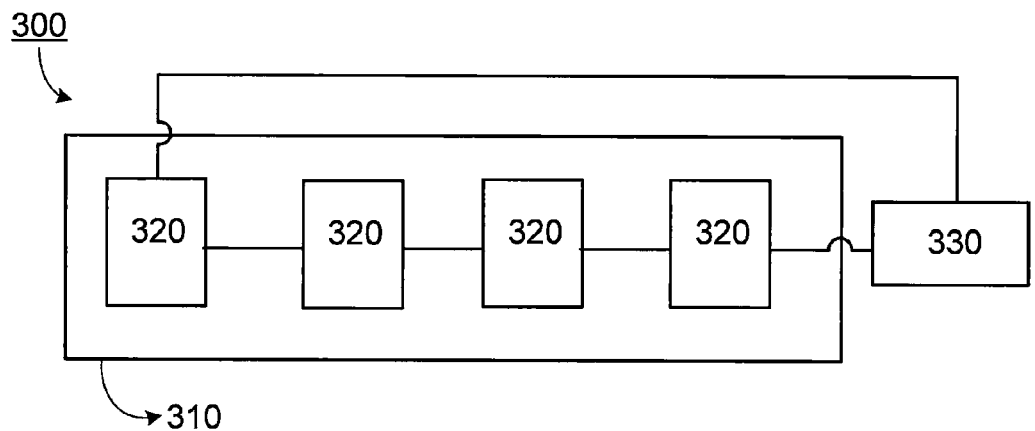
FIG. 3 is a schematic of a system containing multiple photovoltaic cells electrically connected in series.
Figure 4:
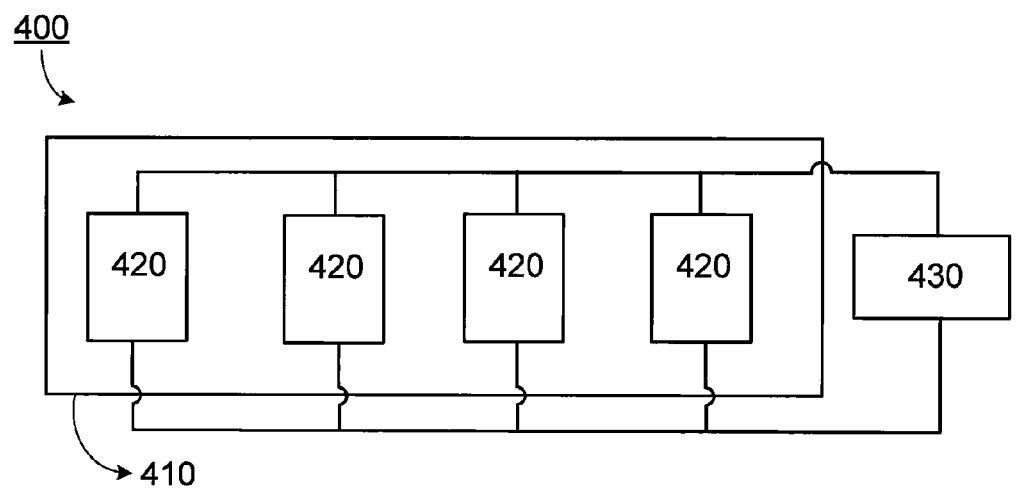
FIG. 4 is a schematic of a system containing multiple photovoltaic cells electrically connected in parallel.

In some embodiments, multiple photovoltaic cells can be electrically connected to form a photovoltaic system. As an example, FIG. 3 is a schematic of a photovoltaic system 300 having a module 310 containing photovoltaic cells 320. Cells 320 are electrically connected in series, and system 300 is electrically connected to a load 330. As another example, FIG. 4 is a schematic of a photovoltaic system 400 having a module 410 that contains photovoltaic cells 420. Cells 420 are electrically connected in parallel, and system 400 is electrically connected to a load 430. In some embodiments, some (e.g., all) of the photovoltaic cells in a photovoltaic system can have one or more common substrates. In certain embodiments, some photovoltaic cells in a photovoltaic system are electrically connected in series, and some of the photovoltaic cells in the photovoltaic system are electrically connected in parallel.

While organic photovoltaic cells have been described, other photovoltaic cells can also be integrated with one of the novel polymers described herein. Examples of such photovoltaic cells include dye sensitized photovoltaic cells and inorganic photoactive cells with an photoactive material formed of amorphous silicon, cadmium selenide, cadmium telluride, copper indium selenide, and copper indium gallium selenide. In some embodiments, a hybrid photovoltaic cell can be integrated with one of the polymers described herein.

While photovoltaic cells have been described above, in some embodiments, the polymers described herein can be used in other devices and systems. For example, the polymers can be used in suitable organic semiconductive devices, such as field effect transistors, photodetectors (e.g., IR detectors), photovoltaic detectors, imaging devices (e.g., RGB imaging devices for cameras or medical imaging systems), light emitting diodes (LEDs) (e.g., organic LEDs (OLEDs) or IR or near IR LEDs), lasing devices, conversion layers (e.g., layers that convert visible emission into IR emission), amplifiers and emitters for telecommunication (e.g., dopants for fibers), storage elements (e.g., holographic storage elements), and electrochromic devices (e.g., electrochromic displays).

The following examples are illustrative and not intended to be limiting.

Example 1

Synthesis of 2,6-bis(trimethylstannyl)-4,4-bis(2-ethylhexyl)-4H-silolo[3,2-b:4,5-b']dithiophene

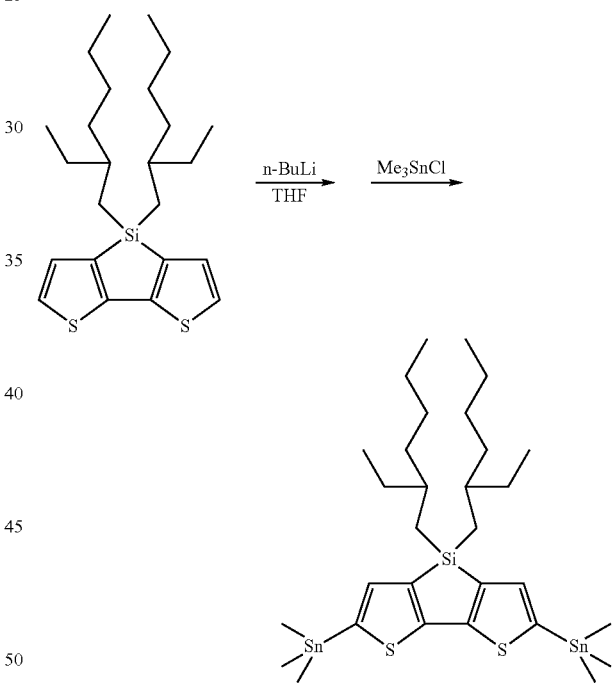

0.737 g (about 1.76 mmol) of 3,3'-(2-ethylhexyl)silylene-2,2'-dithiophene was dissolved in 20 ml of freshly distilled dry THF. The solution was purged with nitrogen for 15 minutes and cooled to −78° C. 4.00 ml of n-butyl lithium in hexane (10 mmol) was added dropwise to the above. The reagents was allowed to react for two hour at this temperature. The solution was then warmed to room temperature. After the reaction was continued for another 2.5 hours, the solution was cooled down to −78° C. again and 12.00 ml (12.00 mmol) of trimethyltin chloride in hexane was added dropwise into the reaction solution. After the solution was stirred at −78° C. for two additional hours, the solution was warmed to room temperature. The reaction was continued for 16 more hours. Upon the completion of reaction, 100 ml of distilled water was added and reaction product was extracted with toluene (3×60 ml). The combined organic phase was washed with distilled water (3×150 ml) and dried over sodium sulfate. The organic solvent was then removed via rotary evaporation under vacuum. The residue was dissolved in toluene and quickly passed through a silica-gel pad pretreated with triethyl amine. The organic solvent was removed under vacuum to give 1.048 g of the target compound. The reaction yield was about 86.50%.

$^1$H NMR in CDCl$_3$: 7.00 (m, 2H), 1.25-1.42 (m, 16H), 0.86-0.94 (m, 10H), and 0.38 (m, 18H).

Example 2

Synthesis of 4,4-bis-(2-ethylhexyl)-2,6-bis-trimethylstannanyl-4H-cyclopenta[2,1-b; 3,4-b']dithiophene Starting material 4,4-Bis-(2-ethylhexyl)-4H-cyclopenta[2,1-b; 3,4-b']dithiophene (1.5 g, 0.00372 mol) was dissolved in dry THF (20 mL). After the solution was cooled to −78° C., butyl lithium (5.21 mL, 0.0130 mol) was added dropwise. The reaction mixture was stirred at this temperature for 1 hour. It was then warmed to room temperature and stirred for another 3 hours. The mixture was again cooled to −78° C. and trimethyltin chloride (1 M in hexane, 15.6 mL, 15.6 mmol) was added dropwise. The reaction mixture was allowed to warm to room temperature and stirred overnight (c.a. 16 hours).

Water was added and the reaction was extracted with toluene. The organic layer was washed with water, dried over sodium sulfate, and concentrated. The residue was dissolved in toluene, and quickly passed through a small plug of silica gel pretreated with triethylamine. The solvent was removed and the residue was dried under vacuum. 1.25 g of the product was obtained. $^1$H NMR (CDCl$_3$, 250 MHz): 6.96 (m, 2H), 1.85 (m, 4H), 1.29 (m, 2H), 0.92 (m, 16H), 0.78 (t, 6.8 Hz, 6H), 0.61 (t, 7.3 Hz, 6H), 0.38 (m, 18H).

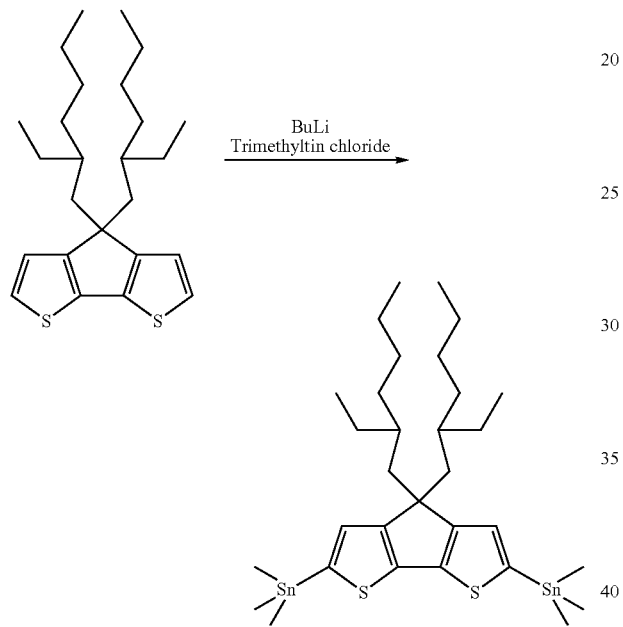

Example 3

Polymerization between 2,6-bis(trimethylstannyl)-4,4-bis(2-ethylhexyl)-4H-silolo[3,2-b:4,5-b']dithiophene, 4,4-bis(2-ethylhexyl)-2,6-bis(trimethylstannanyl)-4H-cyclopenta[2,1-b:3,4-b']dithiophene, and 4,7-dibromo-2,1,3-benzothiadiazole

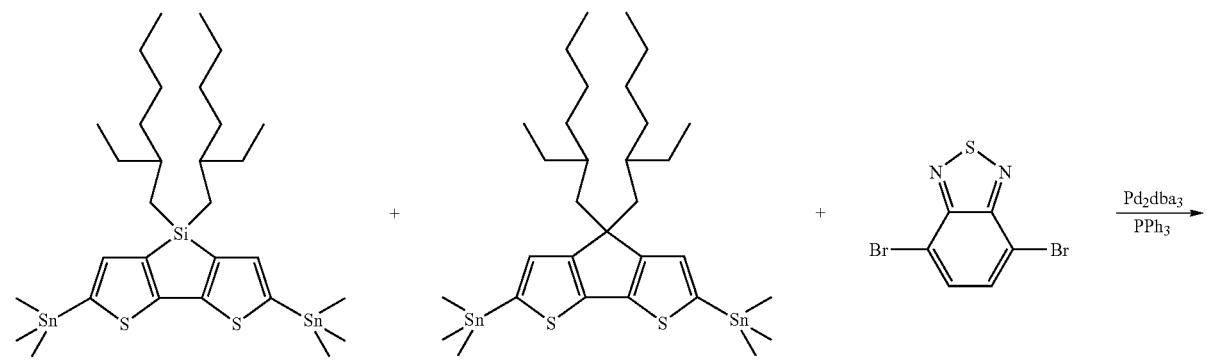

-continued

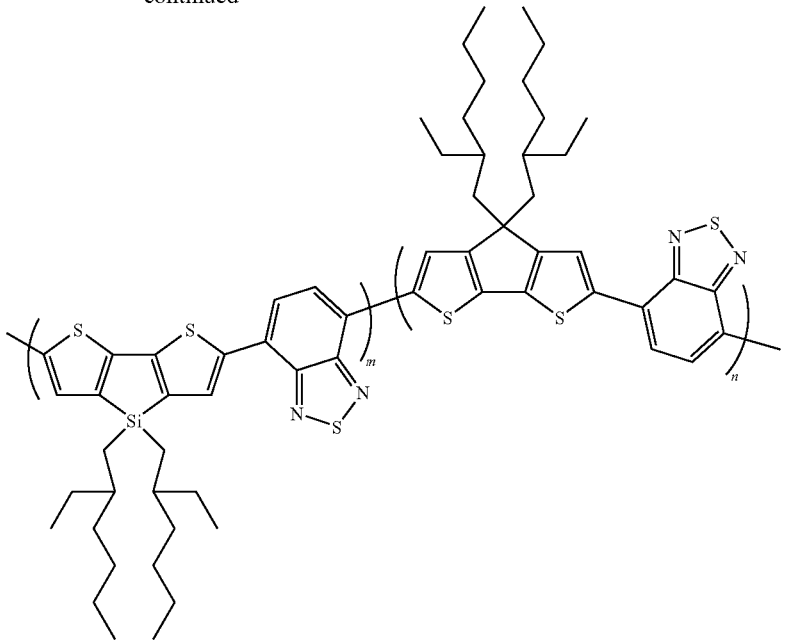

2,6-Bis(trimethylstannyl)-4,4-bis-(2-ethylhexyl)-4H-silolo[3,2-b:4,5-b']dithiophene (0.2766 g, 0.3715 mmol), 4,4-bis(2-ethylhexyl)-2,6-bis(trimethylstannanyl)-4H-cyclopenta[2,1-b; 3,4-b']dithiophene (0.1353 g, 0.1858 mmol), 4,7-dibromo-2,1,3-benzothiadiazole (0.1575 g, 0.5359 mmol), tris(dibenzylideneacetone)-dipalladium (14.7 mg, 16.1 μmol), and triphenylphosphine (33.7 mg, 0.129 mmol) were dissolved in toluene (100 mL). The reaction was purged with argon for 15 minutes and was heated at 120° C. for 48 hours. The solvent was then removed under vacuum and the residue was dissolved in hot dichlorobenzene (about 100 mL). A solution of sodium diethyldithiocarbamate trihydrate (6 g in 170 mL water) was added. The mixture was stirred at 80° C. for 24 hours. After the organic layer was separated, washed with water, precipitated into methanol (800 mL), the solid was collected by filtration, transferred to a thimble in a Soxhlet extractor. The solid was extracted with methanol for 24 hours, acetone for 20 hours, and then dichloromethane for 4 hours. The polymer thus obtained was then dissolved in hot 1,2-dichlorobenzene (60 mL) and was precipitated into methanol (about 700 mL). The polymer was collected by filtration as a blue solid. The yield of this reaction was 121 mg (~41%).

Example 4

Fabrication of Solar Cells

A polymer of the following formula:

(polymer 1)

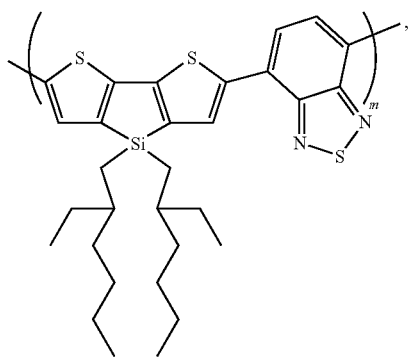

and the polymer described in Example 3 above (polymer 2) were used to fabricate solar cells. Polymer 1 was prepared in a similar manner to polymer 2 except that only two types of comonomer repeat units were used.

The solar cells were fabricated following the methods described in Waldauf et al., J. Appl. Phys. 99, 104503 2006. Briefly, on an ITO coated glass, TiOx was applied onto the ITO layer to form a hole blocking layer. A solution of polymer 1 or 2 and C61-PCBM in o-dichlorobenzene was blade-coated onto the hole blocking layer at 75° C. to form a photoactive layer. A mixture of PEDOT:PSS was then coated onto the photoactive layer to form a hole injection layer. The devices were finished by evaporation of 100 nm Ag onto the hole carrier layer to form the top electrode.

The results showed that, when tested under simulated AM1.5G illumination (ORIEL Solar Simulator), the solar cell containing polymer 1 in the photoactive layer exhibited a $J_{sc}$ of 8.1 mA.cm$^{-2}$, a $V_{oc}$ of 520 mV, and a fill factor of 0.31. The overall efficiency was calculated to be 1.4%. Without wishing to be bound by theory, it is believed that the relative poor performance is attributed to a poor morphology of the photoactive layer, which hinders exciton dissociation and charge transport.

Unexpectedly, when tested under the same conditions, the solar cell containing polymer 2 in the photoactive layer exhibited much better performance even when the polymer was blade-coated at a relative low temperature (i.e., 75° C.). Specifically, the results showed that the solar cell containing polymer 2 exhibited a $J_{sc}$ of 15.1 mA.cm$^{-2}$, a $V_{oc}$ of 570 mV, and a fill factor of 0.57. The overall efficiency was calculated to be as high as about 5%. Without wishing to be bound by theory, it is believed that the improved solubility of polymer 2 in an organic solvent allowed formation of a photoactive layer with a better morphology, thereby significantly improving the performance of the solar cell.

Other embodiments are in the claims.

41. The polymer of claim 40, wherein the polymer is
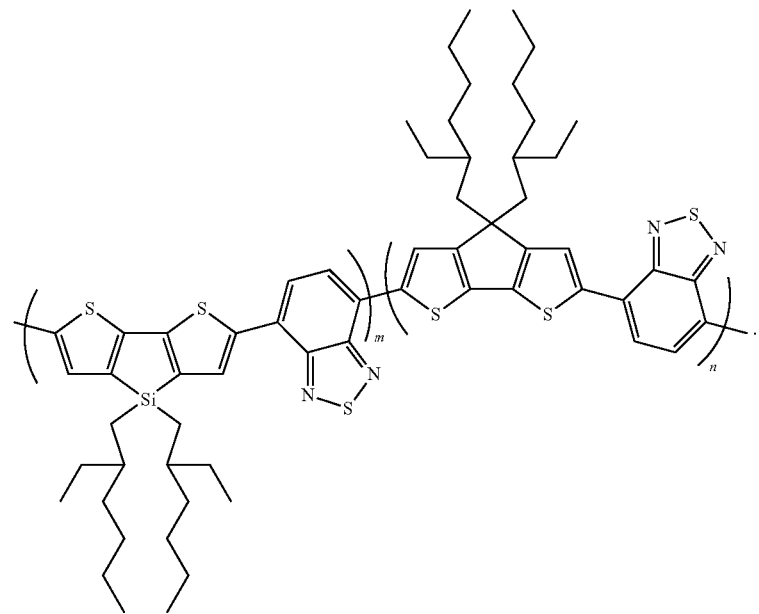

What is claimed is:

1. An article, comprising:
   a first electrode;
   a second electrode; and
   a photoactive material between the first and second electrodes, the photoactive material comprising a polymer including first, second, and third comonomer repeat units, the first comonomer repeat unit comprising a silacyclopentadithiophene moiety, the second comonomer repeat unit comprising a cyclopentadithiophene moiety, and the third comonomer repeat unit comprising a benzothiadiazole moiety;
   wherein the article is configured as a photovoltaic cell.

2. The article of claim 1, wherein the molar ratio of the first and second comonomer repeat units is at most about 5:1.

3. The article of claim 1, wherein the molar ratio of the first and second comonomer repeat units is at least about 1:1.

4. The article of claim 1, wherein the molar ratio of the first and second comonomer repeat units is about 3:1.

5. The article of claim 1, wherein the first comonomer repeat unit comprises a silacyclopentadithiophene moiety of formula (1):

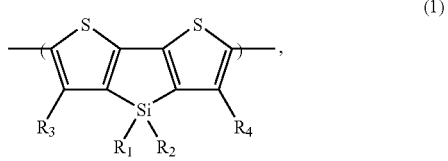

(1)

in which each of $R_1$, $R_2$, $R_3$, and $R_4$, independently, is H, $C_1$-$C_{20}$alkyl, $C_1$-$C_{20}$alkoxy, $C_3$-$C_{20}$cycloalkyl, $C_1$-$C_{20}$heterocycloalkyl, aryl, heteroaryl, halo, CN, OR, C(O)R, C(O)OR, or $SO_2R$; R being H, $C_1$-$C_{20}$alkyl, $C_1$-$C_{20}$alkoxy, aryl, heteroaryl, $C_3$-$C_{20}$cycloalkyl, or $C_1$-$C_{20}$heterocycloalkyl.

6. The article of claim 5, wherein each of $R_1$ and $R_2$, independently, is H, $C_1$-$C_{20}$alkyl, $C_1$-$C_{20}$alkoxy, $C_3$-$C_{20}$cycloalkyl, $C_1$-$C_{20}$heterocycloalkyl, aryl, heteroaryl.

7. The article of claim 6, wherein each of $R_1$ and $R_2$, independently, is $C_1$-$C_{20}$alkyl.

8. The article of claim 7, wherein each of $R_1$ and $R_2$ is 2-ethylhexyl.

9. The article of claim 1, wherein the second comonomer repeat unit comprises a cyclopentadithiophene moiety of formula (2):

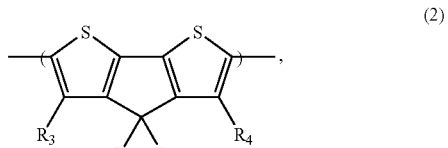

(2)

in which each of $R_1$, $R_2$, $R_3$, and $R_4$, independently, is H, $C_1$-$C_{20}$alkyl, $C_1$-$C_{20}$alkoxy, $C_3$-$C_{20}$cycloalkyl, $C_1$-$C_{20}$heterocycloalkyl, aryl, heteroaryl, halo, CN, OR, C(O)R, C(O)OR, or $SO_2R$; R being H, $C_1$-$C_{20}$alkyl, $C_1$-$C_{20}$alkoxy, aryl, heteroaryl, $C_3$-$C_{20}$cycloalkyl, or $C_1$-$C_{20}$heterocycloalkyl.

10. The article of claim 9, wherein each of $R_1$ and $R_2$, independently, is H, $C_1$-$C_{20}$alkyl, $C_1$-$C_{20}$alkoxy, $C_3$-$C_{20}$cycloalkyl, $C_1$-$C_{20}$heterocycloalkyl, aryl, heteroaryl.

11. The article of claim 10, wherein each of $R_1$ and $R_2$, independently, is $C_1$-$C_{20}$alkyl.

12. The article of claim 11, wherein each of $R_1$ and $R_2$ is 2-ethylhexyl.

13. The article of claim 1, wherein the third comonomer repeat unit comprises a benzothiadiazole moiety of formula (3):

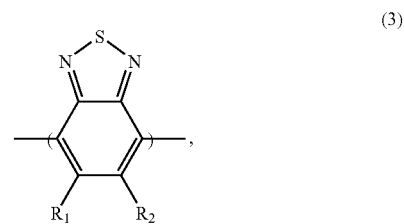

(3)

in which each of $R_1$ and $R_2$, independently, is H, $C_1$-$C_{20}$alkyl, $C_1$-$C_{20}$alkoxy, $C_3$-$C_{20}$cycloalkyl, $C_1$-$C_{20}$heterocycloalkyl, aryl, heteroaryl, halo, CN, OR, C(O)R, C(O)OR, or $SO_2R$; R being H, $C_1$-$C_{20}$alkyl, $C_1$-$C_{20}$alkoxy, aryl, heteroaryl, $C_3$-$C_{20}$cycloalkyl, or $C_1$-$C_{20}$heterocycloalkyl.

14. The article of claim 13, wherein each of $R_1$ and $R_2$, independently, is H.

15. The article of claim 1, wherein the polymer is an electron donor material.

16. The article of claim 15, wherein the article further comprises an electron acceptor material.

17. The article of claim 16, wherein the electron acceptor material comprises a material selected from the group consisting of fullerenes, inorganic nanoparticles, oxadiazoles, discotic liquid crystals, carbon nanorods, inorganic nanorods, polymers containing CN groups, polymers containing $CF_3$ groups, and combinations thereof.

18. The article of claim 17, wherein the electron acceptor material comprises a substituted fullerene.

19. The article of claim 18, wherein the substituted fullerene comprises C61-PCBM or C71-PCBM.

20. The article of claim 1, wherein the article has an efficiency of at least about 4 under AM 1.5 conditions.

21. The article of claim 1, wherein the article has an efficiency of at least about 5 under AM 1.5 conditions.

22. A polymer, comprising:
   first, second, and third comonomer repeat units, the first comonomer repeat unit comprising a silacyclopentadithiophene moiety, the second comonomer repeat unit comprising a cyclopentadithiophene moiety, and the third comonomer repeat unit comprising a benzothiadiazole moiety.

23. The polymer of claim 22, wherein the molar ratio of the first and second comonomer repeat units is at most about 5:1.

24. The polymer of claim 22, wherein the molar ratio of the first and second comonomer repeat units is at least about 1:1.

25. The polymer of claim 22, wherein the molar ratio of the first and second comonomer repeat units is about 3:1.

26. The polymer of claim 22, wherein the first comonomer repeat unit comprises a silacyclopentadithiophene moiety of formula (1):

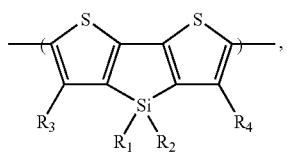

(1)

in which each of $R_1$, $R_2$, $R_3$, and $R_4$, independently, is H, $C_1$-$C_{20}$alkyl, $C_1$-$C_{20}$alkoxy, $C_3$-$C_{20}$cycloalkyl, $C_1$-$C_{20}$heterocycloalkyl, aryl, heteroaryl, halo, CN, OR, C(O)R, C(O)OR, or $SO_2R$; R being H, $C_1$-$C_{20}$alkyl, $C_1$-$C_{20}$alkoxy, aryl, heteroaryl, $C_3$-$C_{20}$cycloalkyl, or $C_1$-$C_{20}$heterocycloalkyl.

27. The article of claim 26, wherein each of $R_1$ and $R_2$, independently, is H, $C_1$-$C_{20}$alkyl, $C_1$-$C_{20}$alkoxy, $C_3$-$C_{20}$cycloalkyl, $C_1$-$C_{20}$heterocycloalkyl, aryl, heteroaryl.

28. The polymer of claim 27, wherein each of $R_1$ and $R_2$, independently, is $C_1$-$C_{20}$alkyl.

29. The polymer of claim 28, wherein each of $R_1$ and $R_2$ is 2-ethylhexyl.

30. The polymer of claim 22, wherein the second comonomer repeat unit comprises a cyclopentadithiophene moiety of formula (2):

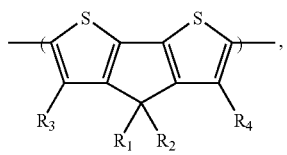

(2)

in which each of $R_1$, $R_2$, $R_3$, and $R_4$, independently, is H, $C_1$-$C_{20}$alkyl, $C_1$-$C_{20}$alkoxy, $C_3$-$C_{20}$cycloalkyl, $C_1$-$C_{20}$heterocycloalkyl, aryl, heteroaryl, halo, CN, OR, C(O)R, C(O)OR, or $SO_2R$; R being H, $C_1$-$C_{20}$alkyl, $C_1$-$C_{20}$alkoxy, aryl, heteroaryl, $C_3$-$C_{20}$cycloalkyl, or $C_1$-$C_{20}$heterocycloalkyl.

31. The article of claim 30, wherein each of $R_1$ and $R_2$, independently, is H, $C_1$-$C_{20}$alkyl, $C_1$-$C_{20}$alkoxy, $C_3$-$C_{20}$cycloalkyl, $C_1$-$C_{20}$heterocycloalkyl, aryl, heteroaryl.

32. The polymer of claim 31, wherein each of $R_1$ and $R_2$, independently, is $C_1$-$C_{20}$alkyl.

33. The polymer of claim 32, wherein each of $R_1$ and $R_2$ is 2-ethylhexyl.

34. The polymer of claim 22, wherein the third comonomer repeat unit comprises a benzothiadiazole moiety of formula (3):

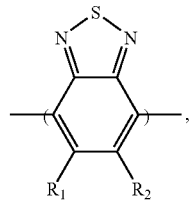

(3)

in which each of $R_1$ and $R_2$, independently, is H, $C_1$-$C_{20}$alkyl, $C_1$-$C_{20}$alkoxy, $C_3$-$C_{20}$cycloalkyl, $C_1$-$C_{20}$heterocycloalkyl, aryl, heteroaryl, halo, CN, OR, C(O)R, C(O)OR, or $SO_2R$; R being H, $C_1$-$C_{20}$alkyl, $C_1$-$C_{20}$alkoxy, aryl, heteroaryl, $C_3$-$C_{20}$cycloalkyl, or $C_1$-$C_{20}$heterocycloalkyl.

35. The polymer of claim 34, wherein each of $R_1$ and $R_2$, independently, is H.

36. The article of claim 1, wherein the polymer is of the following formula:

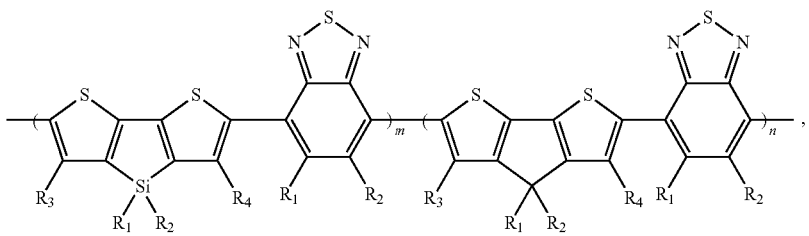

in which each of m and n, independently, is an integer greater than 1;

each of $R_1$, $R_2$, $R_3$, and $R_4$ in the silacyclopentadithiophene moiety, independently, is H, $C_1$-$C_{20}$alkyl, $C_1$-$C_{20}$alkoxy, $C_3$-$C_{20}$cycloalkyl, $C_1$-$C_{20}$heterocycloalkyl, aryl, heteroaryl, halo, CN, OR, C(O)R, C(O)OR, or $SO_2R$; R being H, $C_1$-$C_{20}$alkyl, $C_1$-$C_{20}$alkoxy, aryl, heteroaryl, $C_3$-$C_{20}$cycloalkyl, or $C_1$-$C_{20}$heterocycloalkyl;

each of $R_1$, $R_2$, $R_3$, and $R_4$ in the cyclopentadithiophene moiety, independently, is H, $C_1$-$C_{20}$alkyl, $C_1$-$C_{20}$alkoxy, $C_3$-$C_{20}$cycloalkyl, $C_1$-$C_{20}$heterocycloalkyl, aryl, heteroaryl, halo, CN, OR, C(O)R, C(O)OR, or $SO_2R$; R being H, $C_1$-$C_{20}$alkyl, $C_1$-$C_{20}$alkoxy, aryl, heteroaryl, $C_3$-$C_{20}$cycloalkyl, or $C_1$-$C_{20}$heterocycloalkyl; and each of $R_1$ and $R_2$ in the benzothiadiazole moiety, independently, is H, $C_1$-$C_{20}$alkyl, $C_1$-$C_{20}$alkoxy, $C_3$-$C_{20}$cycloalkyl, $C_1$-$C_{20}$heterocycloalkyl, aryl, heteroaryl, halo, CN, OR, C(O)R, C(O)OR, or $SO_2R$; R being H, $C_1$-$C_{20}$alkyl, $C_1$-$C_{20}$alkoxy, aryl, heteroaryl, $C_3$-$C_{20}$cycloalkyl, or $C_1$-$C_{20}$heterocycloalkyl.

37. The article of claim 36, wherein each of $R_1$ and $R_2$ in the silacyclopentadithiophene moiety, independently, is $C_1$-$C_{20}$alkyl; each of $R_3$ and $R_4$ in the silacyclopentadithiophene moiety is H; each of $R_1$ and $R_2$ in the cyclopentadithiophene moiety, independently, is $C_1$-$C_{20}$alkyl; each of $R_3$ and $R_4$ in the cyclopentadithiophene moiety is H; and each of $R_1$ and $R_2$ in the benzothiadiazole moiety is H.

38. The article of claim 37, wherein the polymer is

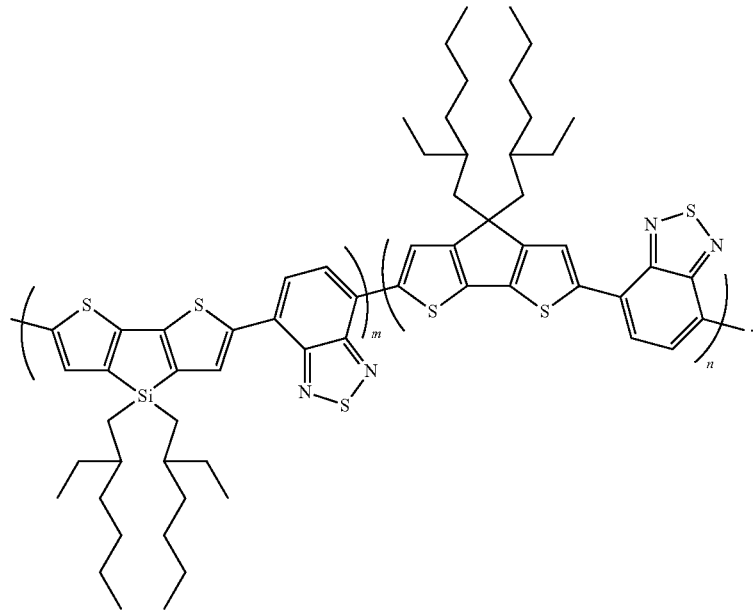

39. The polymer of claim 22, wherein the polymer is of the following formula:

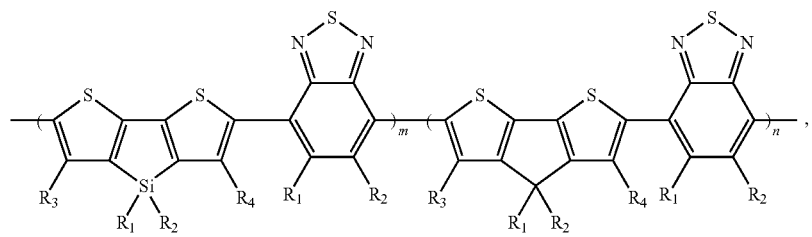

in which
  each of m and n, independently, is an integer greater than 1;
  each of $R_1$, $R_2$, $R_3$, and $R_4$ in the silacyclopentadithiophene moiety, independently, is H, $C_1$-$C_{20}$alkyl, $C_1$-$C_{20}$alkoxy, $C_3$-$C_{20}$cycloalkyl, $C_1$-$C_{20}$heterocycloalkyl, aryl, heteroaryl, halo, CN, OR, C(O)R, C(O)OR, or $SO_2R$; R being H, $C_1$-$C_{20}$alkyl, $C_1$-$C_{20}$alkoxy, aryl, heteroaryl, $C_3$-$C_{20}$cycloalkyl, or $C_1$-$C_{20}$heterocycloalkyl;
  each of $R_1$, $R_2$, $R_3$, and $R_4$ in the cyclopentadithiophene moiety, independently, is H, $C_1$-$C_{20}$alkyl, $C_1$-$C_{20}$alkoxy, $C_3$-$C_{20}$cycloalkyl, $C_1$-$C_{20}$heterocycloalkyl, aryl, heteroaryl, halo, CN, OR, C(O)R, C(O)OR, or $SO_2R$; R being H, $C_1$-$C_{20}$alkyl, $C_1$-$C_{20}$alkoxy, aryl, heteroaryl, $C_3$-$C_{20}$cycloalkyl, or $C_1$-$C_{20}$heterocycloalkyl; and
  each of $R_1$ and $R_2$ in the benzothiadiazole moiety, independently, is H, $C_1$-$C_{20}$alkyl, $C_1$-$C_{20}$alkoxy, $C_3$-$C_{20}$cycloalkyl, $C_1$-$C_{20}$heterocycloalkyl, aryl, heteroaryl, halo, CN, OR, C(O)R, C(O)OR, or $SO_2R$; R being H, $C_1$-$C_{20}$alkyl, $C_1$-$C_{20}$alkoxy, aryl, heteroaryl, $C_3$-$C_{20}$cycloalkyl, or $C_1$-$C_{20}$heterocycloalkyl.

40. The polymer of claim 39, wherein each of $R_1$ and $R_2$ in the silacyclopentadithiophene moiety, independently, is $C_1$-$C_{20}$alkyl; each of $R_3$ and $R_4$ in the silacyclopentadithiophene moiety is H; each of $R_1$ and $R_2$ in the cyclopentadithiophene moiety, independently, is $C_1$-$C_{20}$alkyl; each of $R_3$ and $R_4$ in the cyclopentadithiophene moiety is H; and each of $R_1$ and $R_2$ in the benzothiadiazole moiety is H.